(12) United States Patent
Vacula et al.

(10) Patent No.: US 10,403,624 B2
(45) Date of Patent: Sep. 3, 2019

(54) TRANSISTORS WITH OCTAGON WAFFLE GATE PATTERNS

(71) Applicant: STMICROELECTRONICS DESIGN AND APPLICATION S.R.O., Prague (CZ)

(72) Inventors: Patrik Vacula, Prague (CZ); Milos Vacula, Humenne (SK); Miroslav Husak, Prague (CZ)

(73) Assignee: STMICROELECTRONICS DESIGN AND APPLICATION S.R.O., Prague (CZ)

( * ) Notice: Subject to any disclaimer, the term of this patent is extended or adjusted under 35 U.S.C. 154(b) by 0 days.

(21) Appl. No.: 15/606,773

(22) Filed: May 26, 2017

(65) Prior Publication Data

US 2018/0342504 A1 Nov. 29, 2018

(51) Int. Cl.
| | |
|---|---|
| *H01L 29/10* | (2006.01) |
| *H01L 27/085* | (2006.01) |
| *H01L 29/778* | (2006.01) |
| *H01L 29/66* | (2006.01) |
| *H01L 29/423* | (2006.01) |
| *H01L 23/485* | (2006.01) |
| *H01L 29/417* | (2006.01) |

(Continued)

(52) U.S. Cl.
CPC .......... *H01L 27/085* (2013.01); *H01L 23/485* (2013.01); *H01L 29/1033* (2013.01); *H01L 29/41766* (2013.01); *H01L 29/4232* (2013.01); *H01L 29/42316* (2013.01); *H01L 29/66431* (2013.01); *H01L 29/7786* (2013.01); *H01L 29/7788* (2013.01); *H01L 29/78* (2013.01); *H01L 29/2003* (2013.01); *H01L 29/66462* (2013.01)

(58) Field of Classification Search
CPC .......................... H01L 27/085; H01L 29/1033
USPC ........................................................ 257/192
See application file for complete search history.

(56) References Cited

U.S. PATENT DOCUMENTS 4,959,325 A * 9/1990 Lee .................... H01L 21/76216
257/E21.557
5,192,989 A * 3/1993 Matsushita ......... H01L 29/7801
257/338

(Continued)

OTHER PUBLICATIONS

Cezac, N. et al., "A New Generation of Power Unipolar Devices: the Concept of FLoating Islands MOS Transistor (FLMOST)" ISPSD '2000, pp. 69-72, Toulouse, France, May 22-25, 2000.

(Continued)

*Primary Examiner* — Igwe U Anya
(74) *Attorney, Agent, or Firm* — Seed IP Law Group LLP

(57) ABSTRACT

The present disclosure is directed to a plurality of waffle gate parallel transistors having a shared gate on a surface of a semiconductor substrate. The shared gate has connected lines that form a plurality of frames, lines of each of the frames being over the perimeter of a respective source or drain region. The shared gate includes frames of a first size and shape and frames of a second size and shape, such as squares, rectangles and octagons. The frames having the first size and shape are each over a respective source region and the frames having the second size and shape are each over a respective drain region. Each of the frames having a first size and shape share at least one side with one of the frames having the second size and shape.

17 Claims, 22 Drawing Sheets

(51) Int. Cl.
*H01L 29/78* (2006.01)
*H01L 29/20* (2006.01)

(56) References Cited

U.S. PATENT DOCUMENTS

| | | | |
|---|---|---|---|
| 5,550,728 | A | 8/1996 | Ellis |
| 5,635,742 | A | 6/1997 | Hoshi et al. |
| 5,852,315 | A | 12/1998 | Ker et al. |
| 6,264,167 | B1 * | 7/2001 | Hamazawa .......... H01L 29/7816 251/288 |
| 6,320,223 | B1 | 11/2001 | Hueting et al. |
| 6,437,402 | B1 | 8/2002 | Yamamoto |
| 6,946,706 | B1 | 9/2005 | Brisbin et al. |
| 8,513,716 | B2 | 8/2013 | Ueda et al. |
| 8,791,508 | B2 | 7/2014 | Roberts et al. |
| 9,029,866 | B2 | 5/2015 | Roberts et al. |
| 9,064,947 | B2 | 6/2015 | Roberts et al. |
| 9,583,478 | B1 * | 2/2017 | Martinez ........... H01L 29/41758 |
| 2003/0020092 | A1 | 1/2003 | Parikh et al. |
| 2003/0136984 | A1 | 7/2003 | Masuda et al. |
| 2008/0122014 | A1 * | 5/2008 | Shimomura ......... H01L 29/4238 257/401 |
| 2009/0026506 | A1 * | 1/2009 | Matsumiya ......... H01L 29/0692 257/272 |
| 2009/0166681 | A1 | 7/2009 | Tiebout et al. |
| 2011/0186858 | A1 * | 8/2011 | Roberts ............... H01L 29/205 257/76 |
| 2012/0049243 | A1 | 3/2012 | Wu |
| 2013/0095650 | A1 * | 4/2013 | Shimomura ......... H01L 23/528 438/618 |
| 2014/0353736 | A1 * | 12/2014 | Tanimoto .......... H01L 29/41758 257/288 |
| 2017/0117370 | A1 * | 4/2017 | Rothleitner ......... H01L 29/0615 |

OTHER PUBLICATIONS

Hu, C., "A Parametric Study of Power MOSFETs," Power Electronics Specialists Conference (PESC '79), pp. 385-395, San Diego, California, Jun. 18-22, 2979.

Jayant Baliga, B., "Power Semiconductor Device Figure of Merit for High-Frequency Applications," IEEE Electron Device Letters (10)10:455-457, Oct. 1989.

Koepf, W., "Schwarz-Christoffel Mappings: Symbolic Computation of Mapping Functions for Symmetric Polygonal Domains," Proceedings of the Workshop on Functional-Analytic Methods in Complex Analysis and Applications to Partial Differential Equations, 13 pgs., Jan. 1993.

Malik, Saqib Q. et al., Minimization of Area in Low-Resistance MOS Switches, Proc. 43$^{rd}$ IEEE Midwest Symp. On Circuits and System, pp. 1392-1395, Lansing MI, Aug. 8-11, 2000.

Madhyastha, S. "Design of Circuit Breakers for Large Area CMOS VLSI Circuits," Thesis submitted to the Faculty of Graduate Studies and Research at the Department of Electrical Engineering at McGill University, 84 pgs., Sep. 1989.

Mash-Hud Iqbal, Md et al., "On the Static Performance of the Resurf LDMOSFETs for Power ICs," 21$^{st}$ International Symposium on Power Semiconductor Devices & IC's (SPSD 2009), pp. 247-250, 2009.

Trefethen, L. N., "Analysis and design of polygonal resistors by conformal mapping," Journal of Applied Mathematics and Physics (ZAMP), vol. 35, pp. 693-704, Sep. 1984.

Vacula, P. et a., "Waffle MOS channel aspect ratio calculation with Schwarz-Christoffel transformation," Electroscope, 6 pgs., 2013.

Vacula, P. et al., "Comparison of Waffle and standard gate pattern base on specific on-resistance," Electroscope, Cislo III, 6 pgs., 2014.

* cited by examiner

TRANSISTORS WITH OCTAGON WAFFLE GATE PATTERNS

BACKGROUND

Technical Field

The present disclosure is directed to a plurality of transistors adjacent to one another with a shared gate and, in particular, to gate patterns for shared gate transistors.

Description of the Related Art

When activated, a transistor has a non-zero resistance ($R_{DSon}$) measured across the source and drain terminals. This causes power to be lost across the transistor when it is conducting, potentially leading to overheating or corrupting the signal from the signal being attenuated in the transistor. Thus a transistor may be limited to handling lower voltages or low signal quality applications due to a high value of $R_{DSon}$. The transistor layout can be modified to decrease $R_{DSon}$ to improve transistor performance, such as by creating source/drain asymmetry. For example, $R_{DSon}$ can be decreased by increasing a length of a drain region that charge carriers flow through to be greater than a length of a source region that charge carriers flow through.

Parallel transistor layouts can also be used to decrease $R_{DSon}$ for activated transistors and to increase power capacity of a transistor with a fixed footprint. In a parallel transistor layout, the source, gate, and drain of each transistor are electrically coupled to the respective source, gate, and drain of the remaining transistors in a group of parallel transistors. With parallel transistors, each of the transistors is performance matched to the other transistors because the system is limited by the lowest performing transistor. The parallel transistors can be isolated from one another in adjacent substrates or formed in a common substrate without any isolation. One solution in which the parallel transistors are not isolated from each other is with standard gate parallel transistors having finger interconnects.

FIG. 1 is a perspective cut away view of a high electron mobility transistor (HEMT) device that includes a plurality of standard gate parallel transistors 100. A substrate 102 is covered with a first layer 104, which is covered with a second layer 106. In an example of an HEMT device, the substrate 102 is a semiconductor substrate, such as an aluminum-gallium nitride (AlGaN), or an insulating substrate, such as sapphire ($Al_2O_3$) or diamond (C), the first layer 104 is a semiconductor layer of gallium nitride (GaN), and the second layer 106 is a semiconductor layer of aluminum gallium nitride (AlGaN). The first and second layers 104, 106 are of different materials having different band gaps, thereby forming a heterojunction in which majority charge carriers accumulate in the first layer 104 adjacent to the second layer 106.

A source region 108 is formed in the first layer 104 with a source interconnect finger 110 coupled to the source region 108 by a conductive via 112. One end of the conductive via 112 is embedded in the first layer 104 at the source region 108, extends through the second layer 106, and connects to the source interconnect finger 110 at a via terminal 114, which is an enlarged portion of the source interconnect finger 110. The source interconnect finger 110 couples the source region 108 with other source regions in the plurality of standard gate parallel transistors 100.

Adjacent to the source region 108 is a drain region 116 formed in the first layer 104. A drain interconnect finger 118 is coupled to the drain region 116 by a conductive via 120. One end of the conductive via 120 is embedded in the first layer 104 at the drain region 116, extends through the second layer 106, and connects to the drain interconnect finger 118. The drain interconnect finger 118 couples the drain region 116 with other drain regions in the plurality of standard gate parallel transistors 100. The drain interconnect finger 118 extends in a parallel direction to the source interconnect finger 110.

On the second layer 106, between the source region 108 and the drain region 116, is a gate 122. In the standard gate parallel transistors 100, the gate 122 extends in a parallel direction to the source interconnect finger 110 and the drain interconnect finger 118. To improve $R_{DSon}$, a portion of the gate 122 between the source region 108 and the drain region 116 is positioned closer to the conductive via 112 in the source region 108 than the conductive via 120 in the drain region 116.

The gate 122 controls the conductivity of the first layer 104 from the source region 108 to the drain region 116 by applying a voltage potential to the gate 122. A first channel is activated by a voltage greater than a threshold voltage being applied to the gate 122. When activated, the first channel forms between the source region 108 and the drain region 116, permitting charge carriers to flow between the source region 108 and the drain region 116.

Adjacent to the source region 108 is a drain region 124 formed in the first layer 104. A drain interconnect finger 126 is coupled to the drain region 124 by a conductive via 128. One end of the conductive via 128 is embedded in the first layer 104 at the drain region 124, extends through the second layer 106, and connects to the drain interconnect finger 126. The drain interconnect finger 126 couples the drain region 124 with other drain regions in the plurality of standard gate parallel transistors 100, including the drain region 116. The drain interconnect finger 126 extends in a parallel direction to the source interconnect finger 110.

On the second layer 106 between the source region 108 and the drain region 124 is a continuation of the gate 122. The continuation of the gate 122 extends in a parallel direction to the source interconnect finger 110 and the drain interconnect finger 126. To improve $R_{DSon}$, a portion of the gate 122 between the source region 108 and the drain region 124 is positioned closer to the conductive via 112 in the source region 108 than the conductive via 128 in the drain region 324.

The gate 122 controls the conductivity of the first layer 104 from the source region 108 to the drain region 124 by applying the voltage potential to the gate 122. A second channel is activated by a voltage greater than a threshold voltage being applied to the gate 122. When activated, the second channel forms from the source region 108 to the drain region 116, permitting charge carriers to flow between the source region 108 and the drain region 116.

Although not shown, the source interconnect finger 110 can be coupled to one or more other source interconnect fingers by a source master interconnect. Additionally, the drain interconnect finger 118 and the drain interconnect finger 126 can be coupled to each other or to one or more other drain interconnect fingers by a drain master interconnect, also not shown.

A first transistor of the plurality of standard gate parallel transistors 100 includes the source region 108, the drain region 116, and the gate 122. A second transistor of the plurality of standard gate parallel transistors 100 includes the source region 108, the drain region 124, and the gate 122. The first and second transistors are mirror images along the source region 108. Additional transistors are formed adjacent to the first transistor using the same source interconnect finger 110, drain interconnect finger 118, and gate 122, but with different conductive vias to the first layer 104. Additional transistors are formed adjacent to the second transistor using the same source interconnect finger 110, drain interconnect finger 126, and gate 122, but with different conductive vias to the first layer 104.

FIG. 2 is a top cut away view of the standard gate parallel transistors 100 of FIG. 1. Depicted are six parallel transistors. Each conductive via in the source interconnect finger 110 is coupled to a source region that is shared between two transistors. One transistor extends to the left of the source region to couple to a drain region at a conductive via from the drain interconnect finger 118. The other transistor of the shared source extends to the right of the source region to couple to a drain region at a conductive via from the drain interconnect finger 126. There are three rows of drain-source-drain regions marked by the three rows of conductive vias from the top of the figure to the bottom of the figure. Three rows of pairs of transistors equal six transistors. The pattern repeats, as can be appreciated from the additional rows of gates in which additional transistors can be formed using the drain regions as shared drain regions similar to the source regions depicted.

FIG. 3 is a perspective cut away view of an HEMT device that includes a plurality of square waffle gate parallel transistors 300. A substrate 302 is covered with a first layer 304, which is covered with a second layer 306. A source region 308 is formed in the first layer 304 with a source interconnect finger 310 coupled to the source region 308 by a conductive via 312. One end of the conductive via 312 is embedded in the first layer 304 at the source region 308, extends through the second layer 306, and connects to the source interconnect finger 310 at a via terminal 314, an enlarged portion of the source interconnect finger 310. The source interconnect finger 310 couples the source region 308 with other source regions in the plurality of square waffle gate parallel transistors 300.

Adjacent to the source region 308 is a drain region 316 formed in the first layer 304. A drain interconnect finger 318 is coupled to the drain region 316 by a conductive via 320. One end of the conductive via 320 is embedded in the first layer 304 at the drain region 316, extends through the second layer 306, and connects to the drain interconnect finger 318. The drain interconnect finger 318 couples the drain region 316 with other drain regions in the plurality of square waffle gate parallel transistors 300. The drain interconnect finger 318 extends in a parallel direction to the source interconnect finger 310.

On the second layer 306 between the source region 308 and the drain region 316 is a gate 322. In the square waffle gate parallel transistors 300, the gate 322 extends in a crisscrossing pattern with lines perpendicular to each other and at 45 degrees off of the source interconnect finger 310 and the drain interconnect finger 318. The gate 322 is spaced an equal distance from the conductive via 312 in the source region 308 and the conductive via 320 in the drain region 316, forming equally sized squares around the source region 308 and the drain region 316.

Adjacent to the source region 308 is a drain region 324 formed in the first layer 304. A drain interconnect finger 326 is coupled to the drain region 324 by a conductive via 328. One end of the conductive via 328 is embedded in the first layer 304 at the drain region 324, extends through the second layer 306, and connects to the drain interconnect finger 326. The drain interconnect finger 326 couples the drain region 324 with other drain regions in the plurality of square waffle gate parallel transistors 300, including the drain region 316. The drain interconnect finger 326 extends in a parallel direction to the source interconnect finger 310.

On the second layer 306 between the source region 308 and the drain region 324 is a continuation of the crisscrossing pattern of the gate 322. The gate 322 is spaced an equal distance from the conductive via 312 in the source region 308 and the conductive via 328 in the drain region 324, forming equally sized squares around the source region 308 and the drain region 324.

The source interconnect finger 310 can be coupled to one or more other source interconnect fingers by a source master interconnect 332. Additionally, the drain interconnect finger 318 and the drain interconnect finger 326 can be coupled to each other or to one or more other drain interconnect fingers by a drain master interconnect 330.

A first transistor of the plurality of square waffle gate parallel transistors 300 includes the source region 308, the drain region 316, and the gate 322. A second transistor of the plurality of square waffle gate parallel transistors 300 includes the source region 308, the drain region 324, and the gate 322. The first and second transistors are mirror images along the source region 308. Additional transistors are formed diagonal to the first transistor using the same source interconnect finger 310, drain interconnect finger 318, and gate 322, but with different conductive vias to the first layer 304. Additional transistors are formed diagonal to the second transistor using the same source interconnect finger 310, drain interconnect finger 326, and gate 322, but with different conductive vias to the first layer 304.

FIG. 4 is a top view of the square waffle gate parallel transistors 300 of FIG. 3, with FIG. 3 showing the cut away at the cross section line AA of FIG. 4. Depicted in FIG. 4 are twenty-four parallel transistors. Each conductive via is coupled to a shared source region or a shared drain region. The shared source regions and the shared drain regions may be shared with two or more transistors. As discussed above, the first transistor of the plurality of square waffle gate parallel transistors 300 includes the source region 308, the drain region 316, and the gate 322 and the second transistor of the plurality of square waffle gate parallel transistors 300 includes the source region 308, the drain region 324, and the gate 322, with the first and second transistors sharing the source region 308. The source region 308 is also shared with a third transistor of the plurality of square waffle gate parallel transistors 300 that includes the source region 308, a drain region 402, and the gate 322. Thus the source region 308 is shared between the first, second, and third transistors of the plurality of square waffle gate parallel transistors 300. Similarly, the drain region 324 is a shared drain region. The drain region 324 is one terminal of the second transistor of the plurality of square waffle gate parallel transistors 300, and also is shared with a fourth transistor that includes a source region 404, the drain region 324, and the gate 322. The pattern continues throughout so that there are three transistors per row and three transistors per column in plurality of square waffle gate parallel transistors 300.

FIG. 5 is a side cut away view of the square waffle gate parallel transistors 300 of FIG. 3, taken at the cross section line AA of FIG. 4. FIG. 5 depicts the first and second transistors as discussed above. In addition, FIG. 5 depicts a top surface of the second layer 306 covered by an encapsulant 502 that provides electrical insulation between the components. The encapsulant 502 covers the gate 322, the conductive vias 312, 320, 328, the source and drain interconnect fingers 310, 318, 326, and the source and drain master interconnects 330, 332.

The gate 322 controls the conductivity of the first layer 304 from the source region 308 to the drain region 316 by applying a voltage potential to the gate 322. A first channel 504 is activated by a voltage greater than a threshold voltage being applied to the gate 322. When activated, the first channel 504 forms from the source region 308 to the drain region 316, permitting charge carriers to flow between the source region 308 and the drain region 316.

The gate 322 also controls the conductivity of the first layer 304 from the source region 308 to the drain region 324 by applying the voltage potential to the gate 322. A second channel 506 is activated by a voltage greater than a threshold voltage being applied to the gate 322. When activated, the second channel 506 forms from the source region 308 to the drain region 324, permitting charge carriers to flow between the source region 308 and the drain region 324.

Unlike the plurality of standard gate parallel transistors 100, the square waffle gate parallel transistors 300 have channels with the gate spaced equally between the respective source and the drain regions. With the square waffle gate parallel transistors 300, it is not possible to move a conductive via to change a channel length uniformly for all transistors. Movement of the conductive vias in one direction causes movement in an opposite direction for adjacent transistors. This causes a performance imbalance in the parallel transistors, limiting performance of the square waffle gate parallel transistors 300. Because of the symmetry of the plurality of square waffle gate parallel transistors 300, these devices are typically unsuitable for high voltage devices, such as those higher than 3 volts, for example. Thus, what is needed is a device that allows for matched parallel transistors with non-uniform sized source and drain regions.

BRIEF SUMMARY

The present disclosure is directed to a gate pattern for a plurality of adjacent parallel transistors. In some embodiments the parallel transistors have different shaped source and drain regions and in other embodiments the parallel transistors have unequal source and drain areas. Each transistor of the plurality of adjacent parallel transistors has a gate that has a first frame which extends over a perimeter around lateral edges of a source region and a second frame that extends over a perimeter of lateral edges of a drain region. In some embodiments the first frame is a square and the second frame is an octagon, forming an octagon waffle gate pattern. In other embodiments, the area of the source region is a different size than the area of the drain region, forming a dissimilar square waffle gate pattern. A system including the discussed devices and a method of forming a final package is also disclosed.

In some embodiments, a first transistor of the plurality of adjacent parallel transistors is adjacent to the second transistor of the plurality of adjacent parallel transistors. The first and second transistors have gates that are electrically coupled together. Furthermore, the first transistor has a portion of the gate around the source region shared with a portion of the gate around the drain region of the second transistor. In some embodiments, the first transistor also has a portion of the gate around the drain region shared with a portion of the gate around the source region of the second transistor.

In some embodiments, a portion of the first frame is common with a portion of the second frame. The common portion of the first and second frames is a portion of the gate that controls a semiconductor channel from the source to drain region of the first transistor.

In some embodiments, one source region in the plurality of adjacent parallel transistors is shared between a first group of four transistors and one drain region in the plurality of adjacent parallel transistors is shared between a second group of four transistors, with one transistor in the first and second groups. In an alternate embodiment, a group of four transistors includes a first source region shared by a first transistor and a second transistor, a first drain region shared by the first transistor and a third transistor, a second source region shared by the third transistor and a fourth transistor, and a second drain region shared by the second transistor and the fourth transistor.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense; that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

Throughout the specification, the term "layer" is used in its broadest sense to include a thin film, a cap, or the like, and one layer may be composed of multiple sub-layers.

Specific embodiments of transistors with an octagon waffle gate pattern and dissimilar square waffle gate pattern are described herein; however, the present disclosure and the reference to certain materials, dimensions, and the details and ordering of processing steps are exemplary and should not be limited to those shown.

Figure 1:
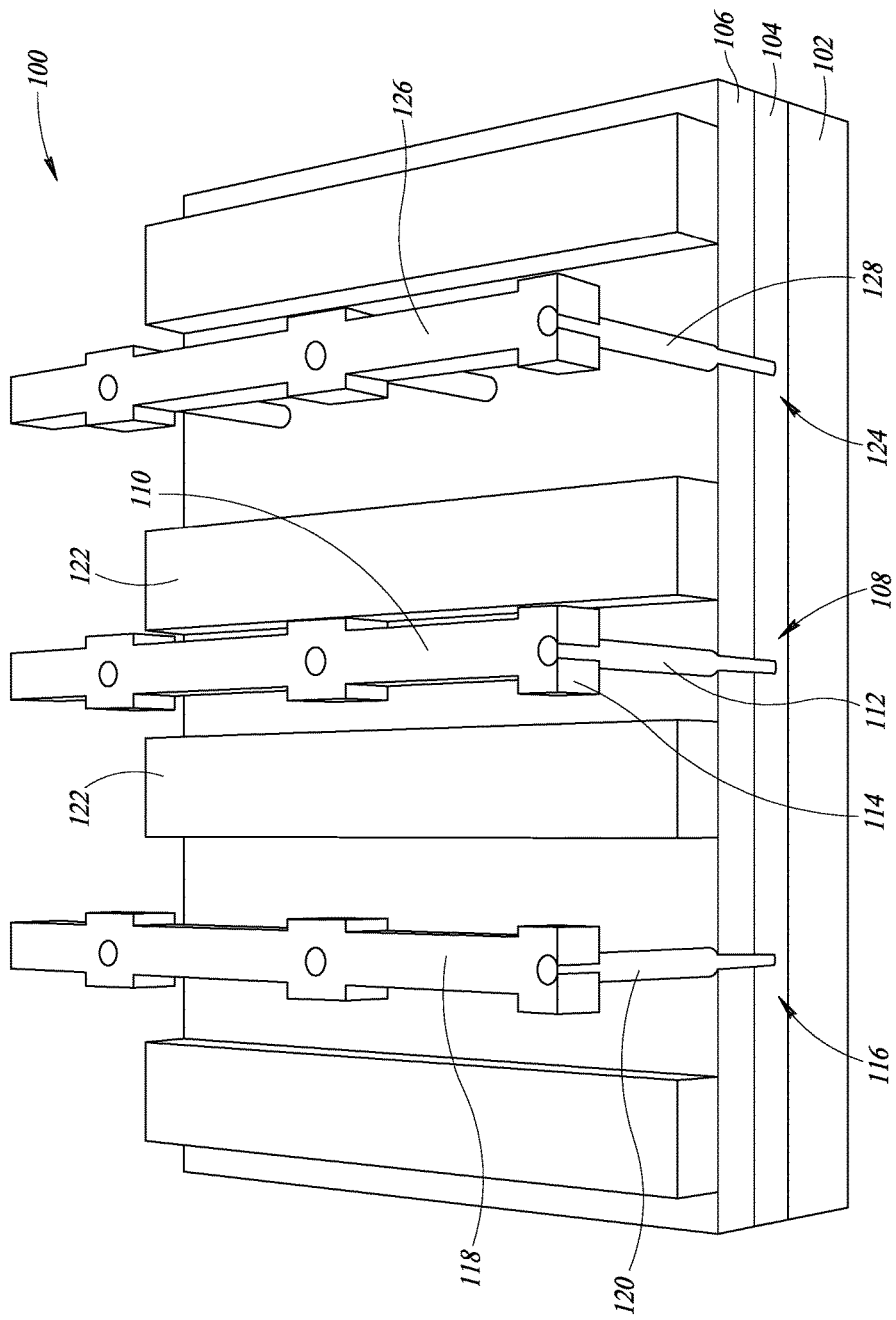
FIG. 1 is a perspective cut away view of a high electron mobility transistor (HEMT) device that includes a plurality of standard gate parallel transistors 100.
Figure 2:
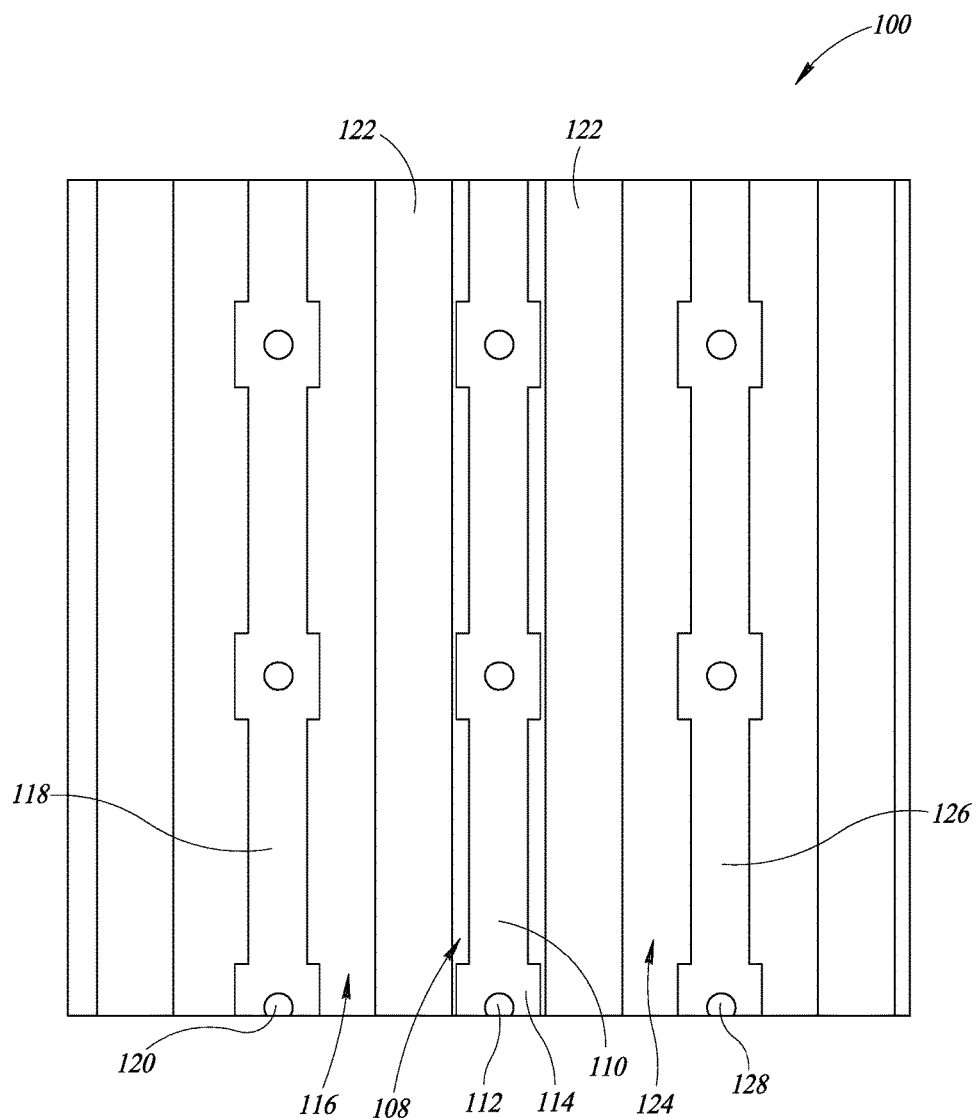
FIG. 2 is a top cut away view of the standard gate parallel transistors 100 of FIG. 1.
Figure 3:
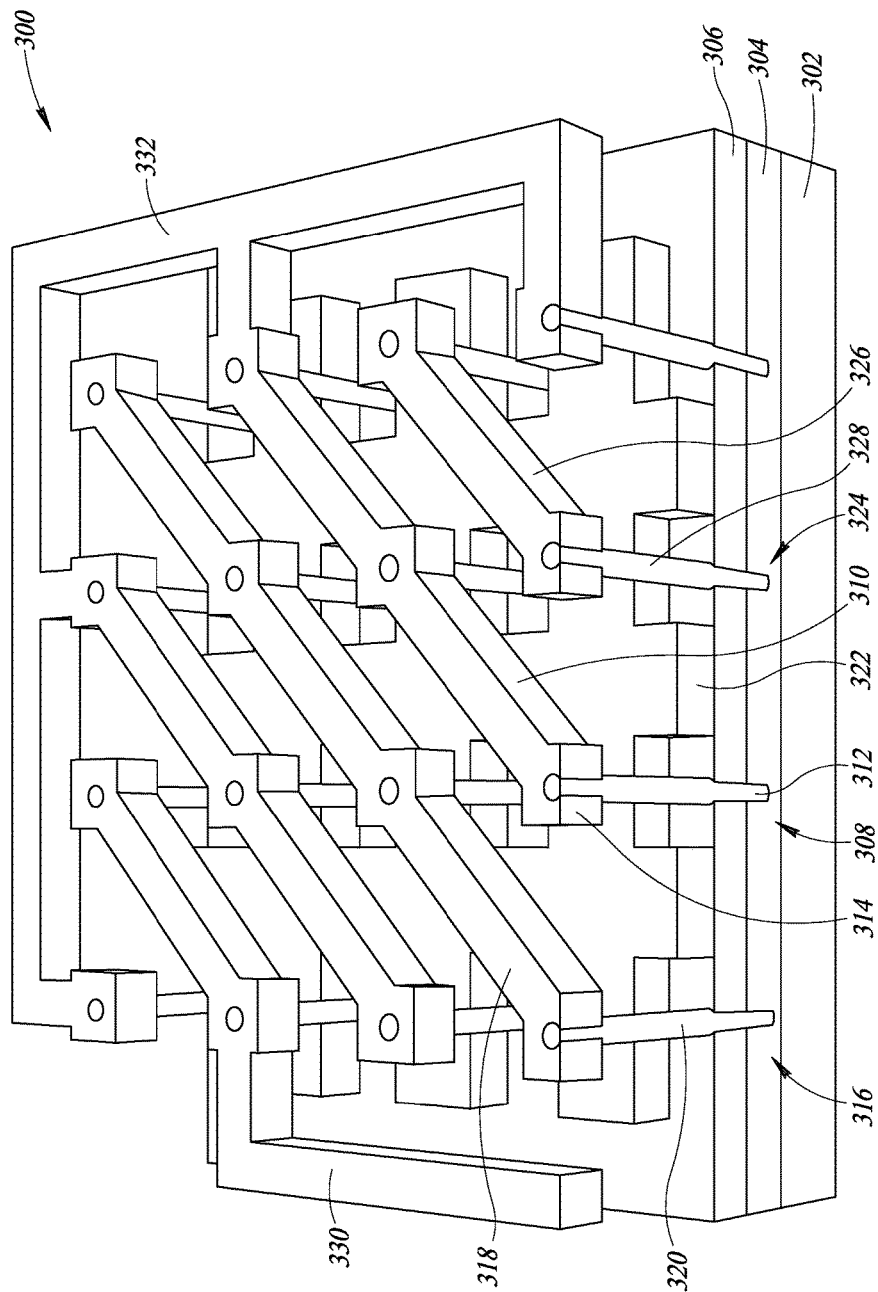
FIG. 3 is a perspective cut away view of an HEMT device that includes a plurality of square waffle gate parallel transistors 300.
Figure 4:
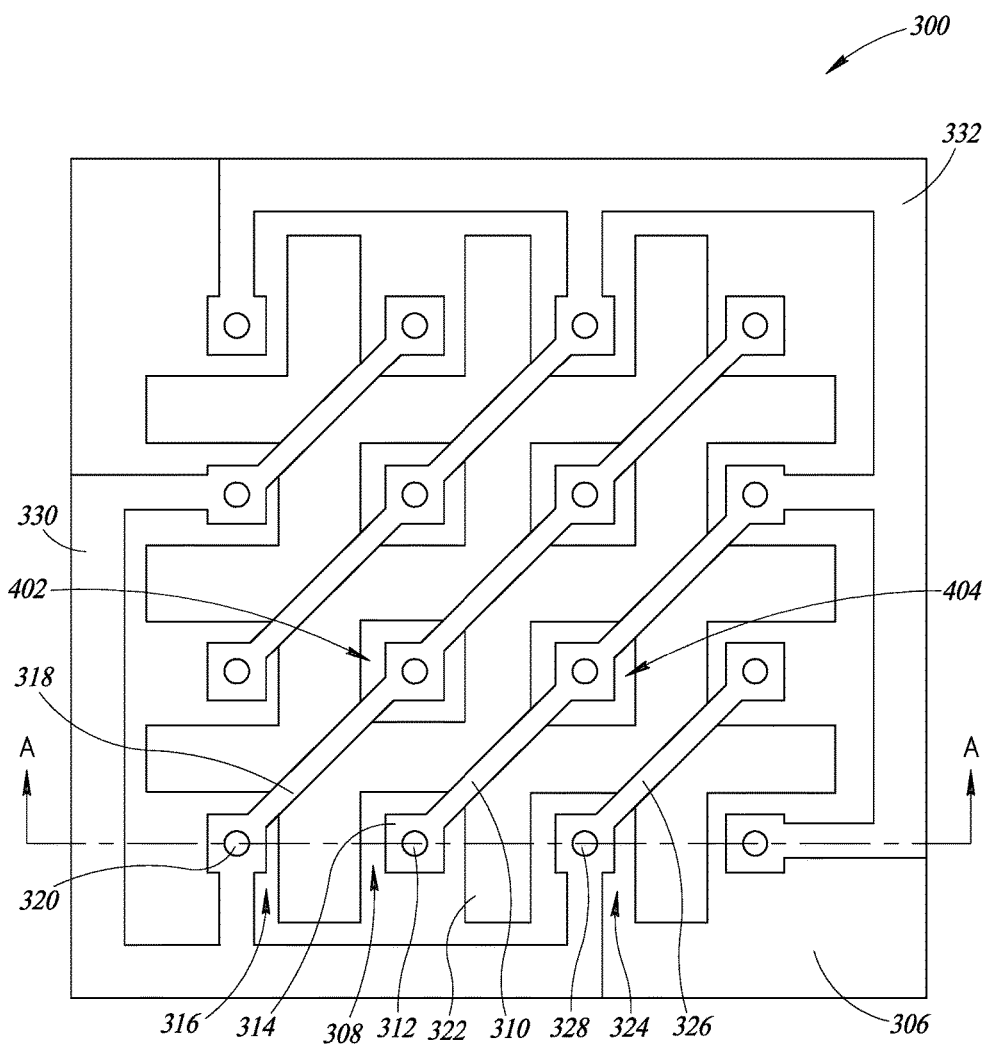
FIG. 4 is a top view of the square waffle gate parallel transistors 300 of FIG. 3, with FIG. 3 showing the cut away at the cross section line AA of FIG. 4.
Figure 5:
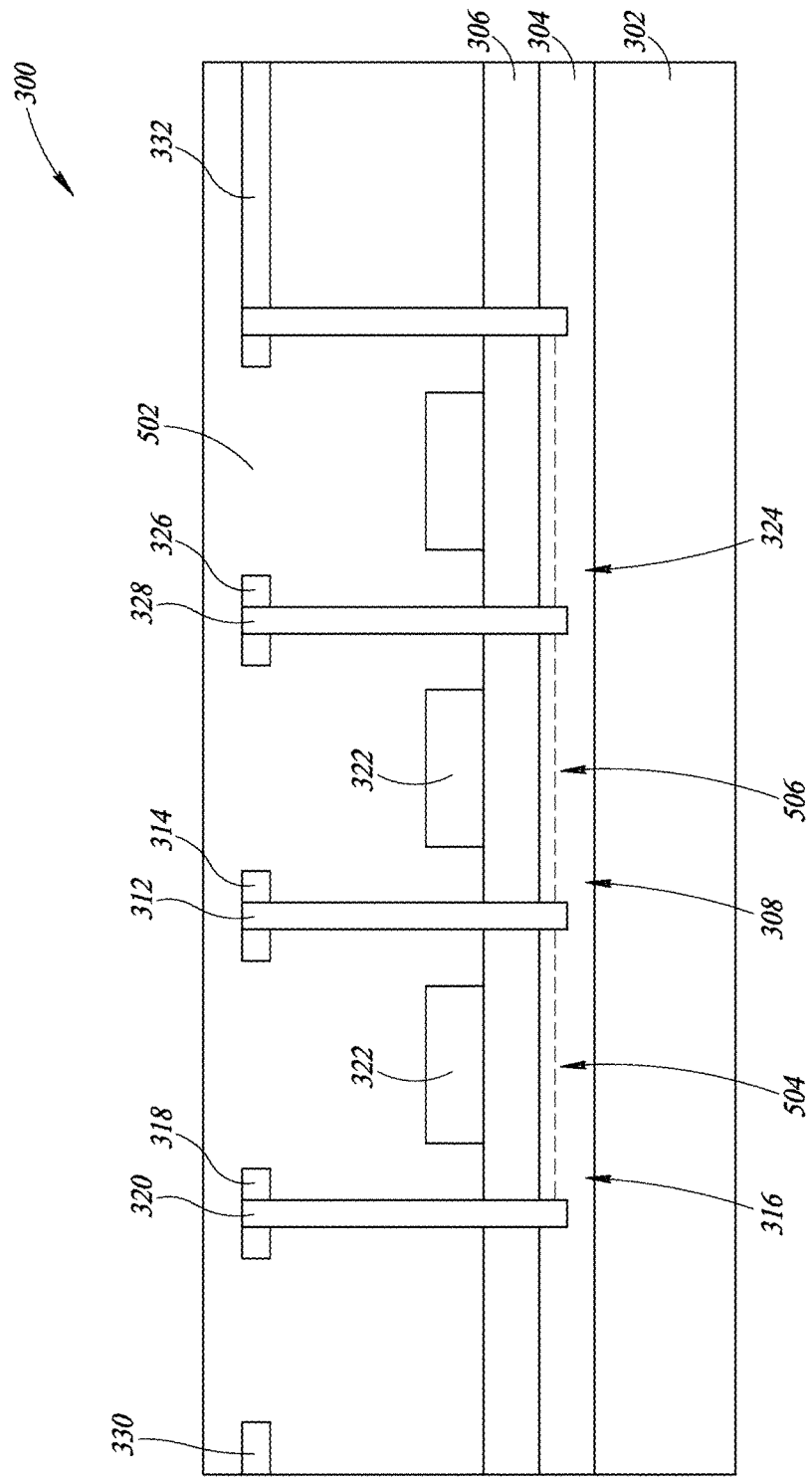
FIG. 5 is a side cut away view of the square waffle gate parallel transistors 300 of FIG. 3, taken at the cross section line AA of FIG. 4.
Figure 6:
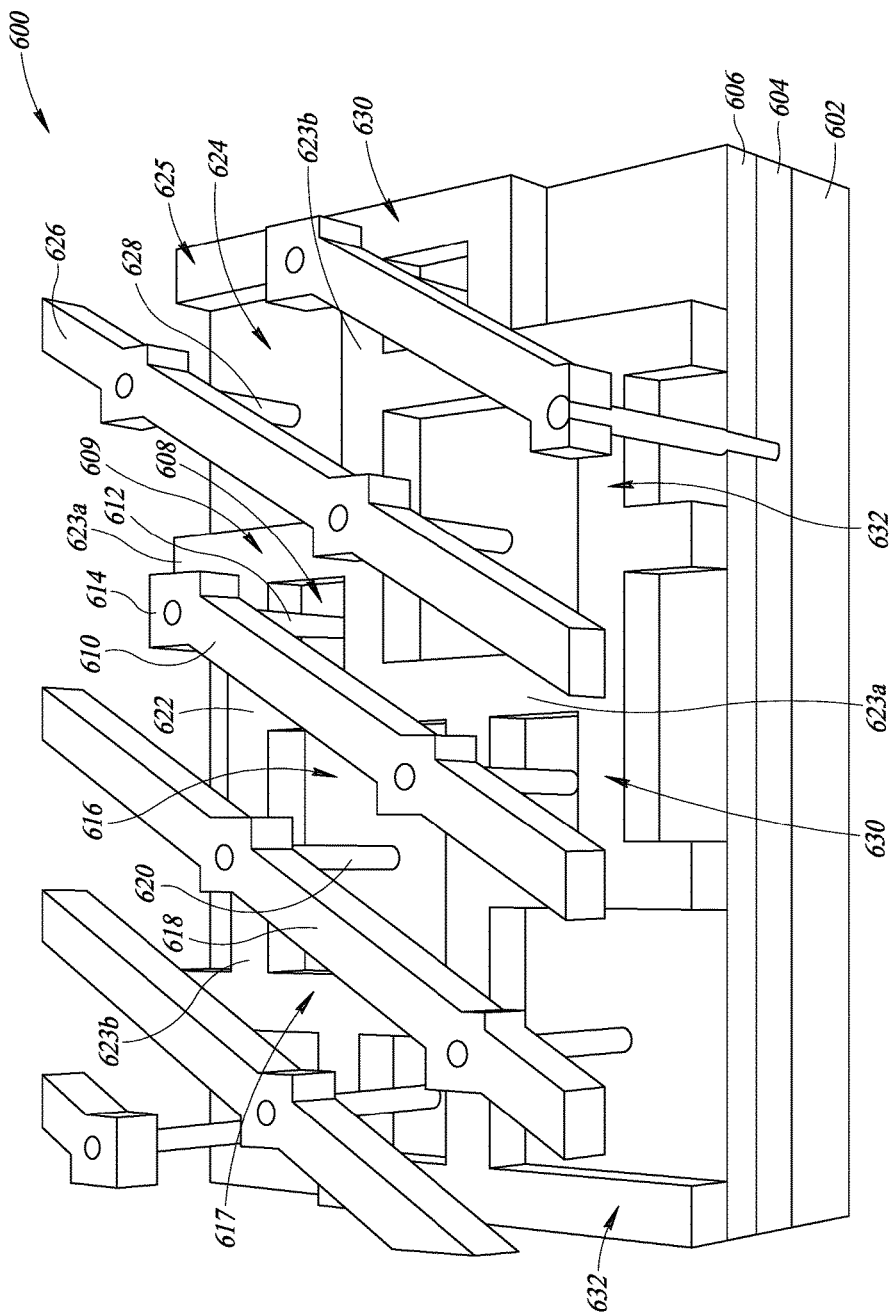
FIG. 6 is a perspective cut away view of an HEMT device that includes a plurality of dissimilar square waffle gate parallel transistors 600.
Figure 15:
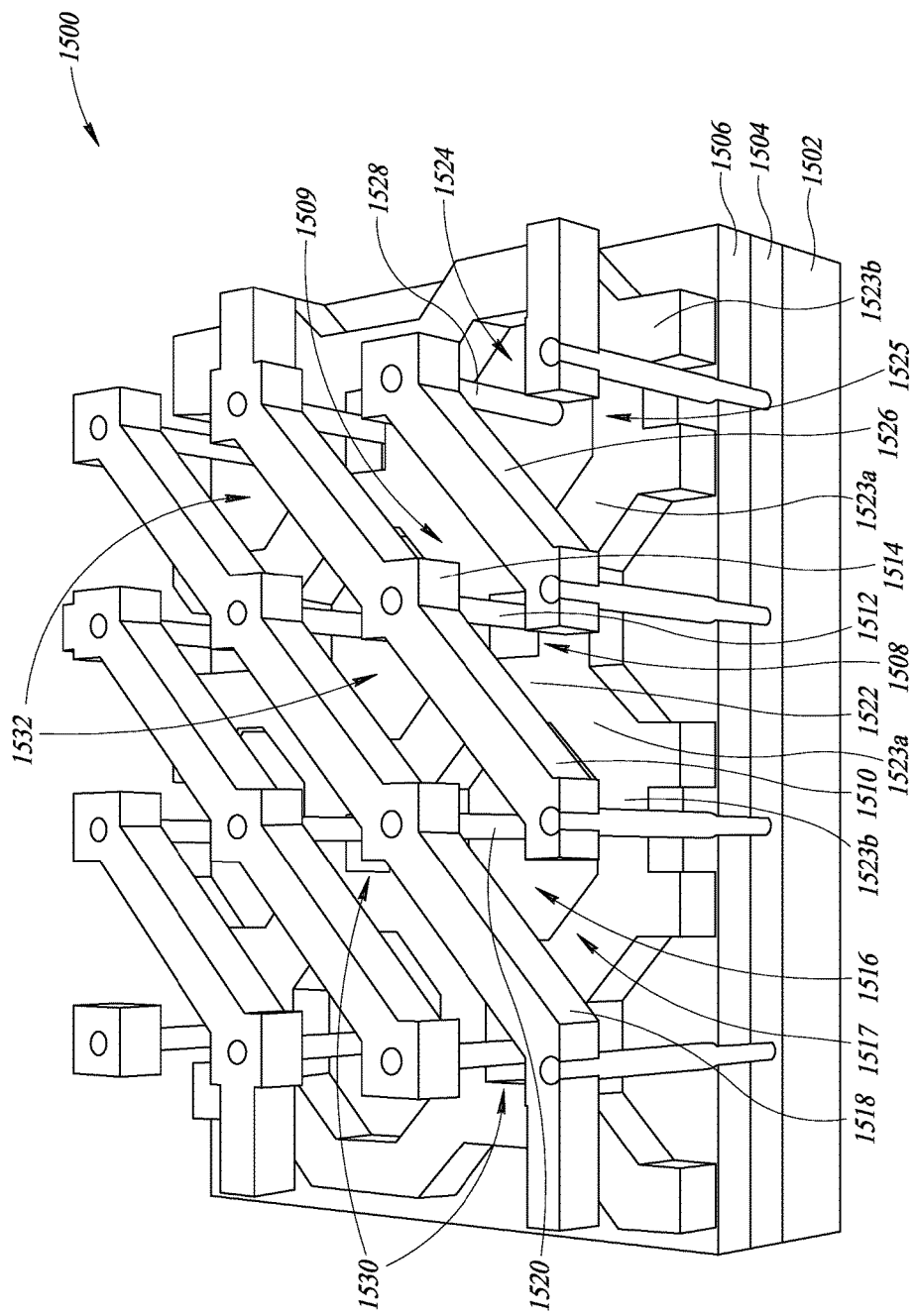
FIG. 15 is a perspective cut away view of an HEMT device that includes a plurality of octagon waffle gate parallel transistors 1500.

The present disclosure is generally directed to transistor gate layouts, such as those shown in the perspective cut away views of FIG. 15 and FIG. 6. The parallel transistor designs have a gate above a semiconductor layer. For the octagon waffle gate parallel transistor, the gate forms a plurality of square frames and a plurality of octagon frames. For the dissimilar square waffle gate parallel transistors, the gate forms a plurality of first frames having a first size and a plurality of second frames having a second size. The frames are formed above the semiconductor layer and lines of the frames define boundaries in source and drain regions in the semiconductor layer.

FIG. 6 is a perspective cut away view of a high electron mobility (HEMT) device that includes a plurality of dissimilar square waffle gate parallel transistors 600. A substrate 602 is covered with a first layer 604, which is covered with a second layer 606. In some embodiments, the substrate 602 and the layers 604, 606 are part of an HEMT. In one of these embodiments, the substrate 602 is aluminum gallium nitride (AlGaN), sapphire (Al$_2$O$_3$) or diamond (C), the first layer 604 is gallium nitride (GaN), and the second layer 606 is AlGaN. The first and second layers 604, 606 are of different materials having different band gaps, thereby forming a heterojunction in which majority charge carriers accumulate in the first layer 604 adjacent to the second layer 606. Other embodiments include other transistor types. Other transistor types may follow the same three layer structure as discussed above or may have a different number or type of layers.

A source region 608 is formed in the first layer 604. The source region 608 is one terminal of one of the plurality of dissimilar square waffle gate parallel transistors 600. In some embodiments, the source region 608 is defined by a frame 609 around the source region 608.

Coupled to the source region 608 is a source interconnect finger 610 coupled to the source region 608 by a conductive via 612. The conductive via 612 passes through the second layer 606 and terminates at a first end in the first layer 604. In other embodiments other connectors are used in place of the conductive via 612, such as a contact pad. The conductive via 612 terminates at a second end in the source interconnect finger 610 at a via terminal 614. The via terminal 614 is an enlarged portion of the source interconnect finger 610 that couples the source interconnect finger 610 to the conductive via 612. The source interconnect finger 610 is a conductive line connecting source regions in the plurality of dissimilar square waffle gate parallel transistors 600 together with respective conductive vias and via terminals.

Adjacent to the source region 608 is a drain region 616 formed in the first layer 604. The drain region 616 is a second terminal of one of the plurality of dissimilar square waffle gate parallel transistors 600. In some embodiments, the drain region 616 is defined by a frame 617 around the drain region 616.

Coupled to the drain region 616 is a drain interconnect finger 618 coupled to the drain region 616 by a conductive via 620. The conductive via 620 passes through the second layer 606 and terminates at a first end in the first layer 604. In other embodiments other connectors are used in place of the conductive via 620, such as a contact pad. The conductive via 620 terminates at a second end in the drain interconnect finger 618 at a via terminal. The via terminal is an enlarged portion of the drain interconnect finger 618 that couples the drain interconnect finger 618 to the conductive via 620. The drain interconnect finger 618 is a conductive line connecting drain regions in the plurality of dissimilar square waffle gate parallel transistors 600 together with respective conductive vias and via terminals. In one embodiment the drain interconnect finger 618 extends in a parallel direction to the source interconnect finger 610.

On the second layer 606 between the source region 608 and the drain region 616 is a gate 622. In the plurality of dissimilar square waffle gate parallel transistors 600, the gate 622 extends across the second layer 606 in a repeating pattern with lines 623a, 623b forming small frames 630 around the source regions and large frames 632 around the drain regions. In an alternative embodiment, the repeating pattern forms small frames around the drain regions and large frames around the source regions. In one embodiment the frames 630, 632 are on the second layer 606 at lateral boundaries of the source region 608 and the drain region 616, with an opening directly over the source region 608 and the drain region 616. Each one of the small frames 630 are adjacent to four large frames 632 and each one of the large frames 632 are adjacent to four small frames 630, except at the perimeter of the pattern in which one or more sides of each frame are not adjacent to another frame. Due to the size disparity of the frames, each large frame 632 is also adjacent to four other large frames 632, except at the perimeter of the pattern in which one or more sides of each frame are not adjacent to another frame.

In some embodiments, each of the frames 630, 632 is rectangular such that each line of the line 623a, 623b of the gate 622 is parallel or perpendicular to every other one of lines 623a, 623b. In an alternate embodiment, each of the frames 630, 632 is a parallelogram such that each line of the gate 622 is parallel to a first group of lines 623a or a second group of lines 623b, the first group of lines 623a not parallel or perpendicular to the second group of lines 623b. In yet another embodiment, each line of the gate 622 is parallel to one of the lines 623a, 623b of the gate 622 and not parallel to one of the lines 623a, 623b of the gate 622.

The source interconnect finger 610 and the drain interconnect finger 618 are in a first plane parallel to a second plane in which the gate 622 resides. The source interconnect finger 610 and the drain interconnect finger 618 extend at a different angle within the first plane than the angle of each line of the gate 622 within the second plane, the angles measured around an axis tangent to the planes. In an alternate embodiment, the source interconnect finger 610 and the drain interconnect finger 618 are at the same angle within the first plane as the angle of the first group of lines 632a of the gate 622 in the second plane. In some embodiments the source interconnect finger 610 and the drain interconnect finger 618 are in different planes parallel to each other. And in some embodiments portions of the source interconnect finger 610 and the drain interconnect finger 618 are in the first plane, and portions of the source interconnect finger 610 and the drain interconnect finger 618 are in a third plane parallel to the first plane. In some embodiments, the source interconnect finger 610 and the drain interconnect finger 618 are parallel to an edge of the die. In some embodiments, at least one of the lines 623a, 623b of the gate 622 is parallel to an edge of the die.

In the embodiment shown in FIG. 6 the gate 622 is not spaced an equal distance from the conductive via 612 in the source region 608 as the conductive via 620 in the drain region 616. Due to source/drain asymmetry, $R_{DSon}$ for the plurality of dissimilar square waffle gate parallel transistors 600 is lower than the plurality of standard gate parallel transistors 100 with an equivalent die footprint and is also lower than the plurality of square waffle gate parallel transistors 300 with an equivalent die footprint.

Alternatively, for a fixed $R_{DSon}$, the plurality of dissimilar square waffle gate parallel transistors 600 has a smaller die footprint than the plurality of standard gate parallel transistors 100 and also has a smaller die footprint than the plurality of square waffle gate parallel transistors 300.

In some embodiments, the source/drain asymmetry also provides for a higher voltage tolerance by the plurality of dissimilar square waffle gate parallel transistors 600 compared to the plurality of standard gate parallel transistors 100 and the plurality of square waffle gate parallel transistors 300. For example, the plurality of dissimilar square waffle gate parallel transistors 600 may be suitable for applications up to 20 volts to 1000 volts, depending on the transistor technology.

Adjacent to the source region 608 on a side opposite from the drain region 616 is a drain region 624 formed in the first layer 604. The drain region 624 is a second terminal of one of the plurality of dissimilar square waffle gate parallel transistors 600. The drain region 624 is defined by doping levels of the first layer 604 in some embodiments. In other embodiments, the drain region 624 is defined by a frame 625 around the drain region 624.

Coupled to the drain region 624 is a drain interconnect finger 626 coupled to the drain region 624 by a conductive via 628. The conductive via 628 passes through the second layer 606 and terminates at a first end in the first layer 604. In other embodiments other connectors are used in place of the conductive via 628, such as a contact pad. The conductive via 628 terminates at a second end in the drain interconnect finger 626 at a via terminal. The via terminal is an enlarged portion of the drain interconnect finger 626 that couples the drain interconnect finger 626 to the conductive via 628. The drain interconnect finger 626 extends linearly, connecting to other drain regions in the plurality of dissimilar square waffle gate parallel transistors 600 with respective conductive vias and via terminals. In one embodiment the drain interconnect finger 626 extends in a parallel direction to the source interconnect finger 610 and the drain interconnect finger 618.

On the second layer 606 between the source region 608 and the drain region 624 is the gate 622. The repeating pattern, with the lines 623a, 623b forming the small frames 630 around the source regions and the large frames 632 around the drain regions, extends around the drain region 624. In one embodiment, each of the frames 630, 632 is rectangular such that each line of the gate 622 is parallel or perpendicular to every other line. In an alternate embodiment, each of the frames 630, 632 is a parallelogram such that each line of the gate 622 is parallel to the first group of lines 623a or the second group of lines 623b, the first group of lines 623a not parallel or perpendicular to the second group of lines 623b. In yet another embodiment, each line of the gate 622 is parallel to one of more than two lines of the gate 622 that are not parallel to each other.

The drain interconnect finger 626 is in the first plane with the source interconnect finger 610 and the drain interconnect finger 618, parallel to the second plane in which the gate 622 resides. The source interconnect finger 610, the drain interconnect finger 618, and the drain interconnect finger 626 extend at a different angle within the first plane than the angle of each line of the gate 622 within the second plane, the angles measured around an axis tangent to the planes. In an alternate embodiment, the source interconnect finger 610, the drain interconnect finger 618, and the drain interconnect finger 626 are at the same angle within the first plane as the angle of the first group of lines 623a of the gate 622 in the second plane. In some embodiments the source interconnect finger 610, the drain interconnect finger 618, and the drain interconnect finger 626 are in different planes parallel to each other. And in some embodiments portions of the source interconnect finger 610, the drain interconnect finger 618, and the drain interconnect finger 626 are in the first plane, and portions of the source interconnect finger 610, the drain interconnect finger 618, and the drain interconnect finger 626 are in the third plane parallel to the first plane. In some embodiments, the source interconnect finger 610, the drain interconnect finger 618, and the drain interconnect finger 626 are parallel to an edge of the die. And in some embodiments, at least one of the lines 623a, 623b of the gate 622 is parallel to an edge of the die.

Figure 7:
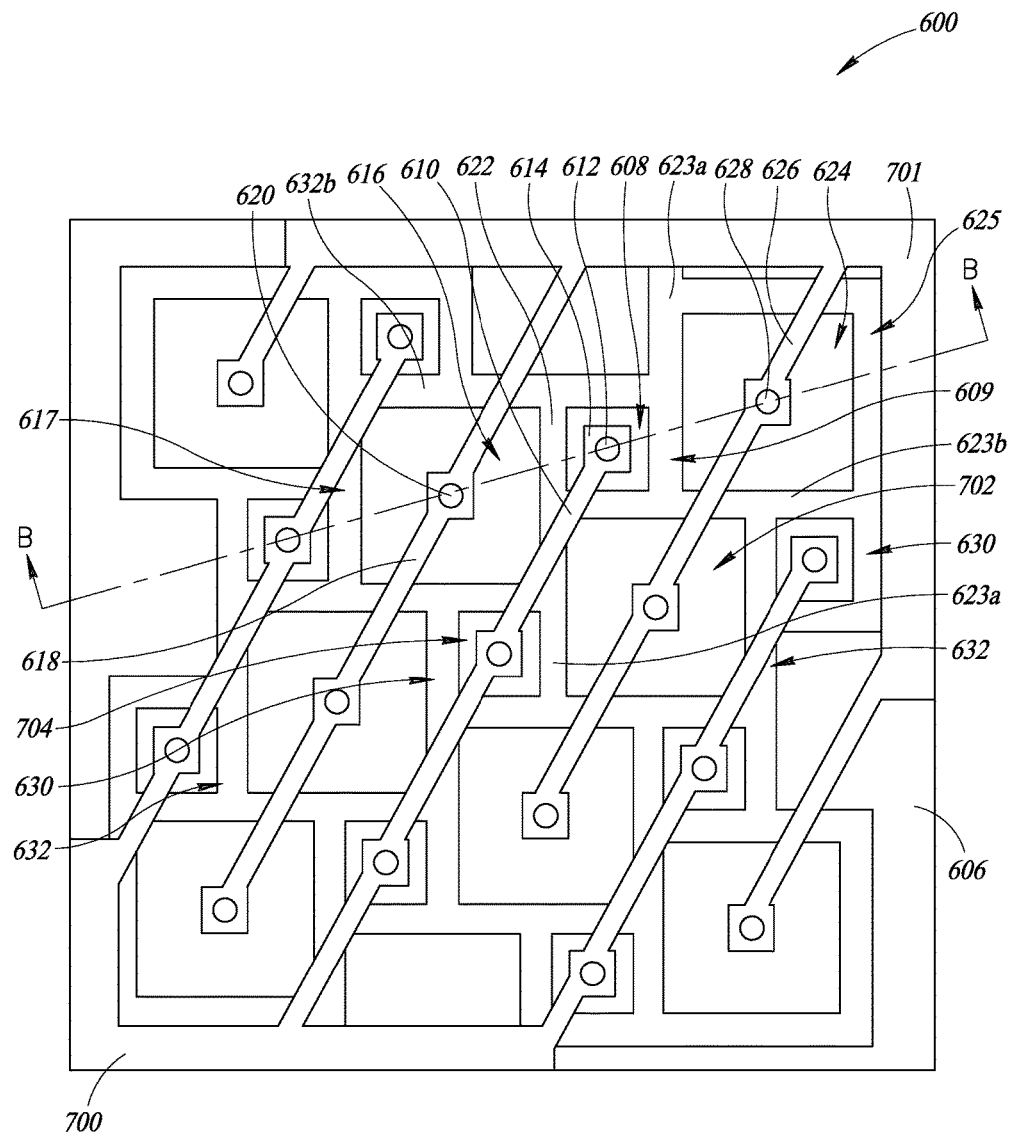
FIG. 7 is a top view of the plurality of dissimilar square waffle gate parallel transistors 600 of FIG. 6.

FIG. 7 is a top view of the plurality of dissimilar square waffle gate parallel transistors 600 of FIG. 6. Depicted in FIG. 7 are 24 parallel transistors. Each conductive via is coupled to a shared source region or a shared drain region. The shared source regions and the shared drain regions may be shared with two or more transistors.

A first transistor of the plurality of dissimilar square waffle gate parallel transistors 600 includes the source region 608, the drain region 616, and the gate 622. A second transistor of the plurality of dissimilar square waffle gate parallel transistors 600 includes the source region 608, the drain region 624, and the gate 622. The first and second transistors are similarly sized and positioned but 180 degrees out of rotation from each other. The source region 608 is also shared with a third transistor of the plurality of dissimilar square waffle gate parallel transistors 600 that includes the source region 608, a drain region 702, and the gate 622. Thus the source region 608 is shared between the first, second, and third transistors of the plurality of dissimilar square waffle gate parallel transistors 600. Similarly, the drain region 616 is a shared drain region. The drain region 616 is one terminal of the second transistor of the plurality of dissimilar square waffle gate parallel transistors 600, and also is shared with a fourth transistor that includes a source region 704, the drain region 616, and the gate 622. The pattern continues throughout so that each source and drain region is a terminal of at least two transistors of the plurality of dissimilar square waffle gate parallel transistors 600.

Additional transistors are formed diagonal to the first transistor using the same source interconnect finger 610, drain interconnect finger 618, and gate 622, but with different conductive vias to the first layer 604. Additional transistors are formed diagonal to the second transistor using the same source interconnect finger 610, drain interconnect finger 626, and gate 622, but with different conductive vias to the first layer 604, such as a fifth transistor that includes the source region 704, the drain region 702, and the gate 622. In addition, in some embodiments, the source interconnect finger 610 is coupled to other source interconnect fingers by a source master interconnect 700, and the drain interconnect finger 618 is coupled to the drain interconnect finger 626 and to other drain interconnect fingers by a drain master interconnect 701.

Figure 8:
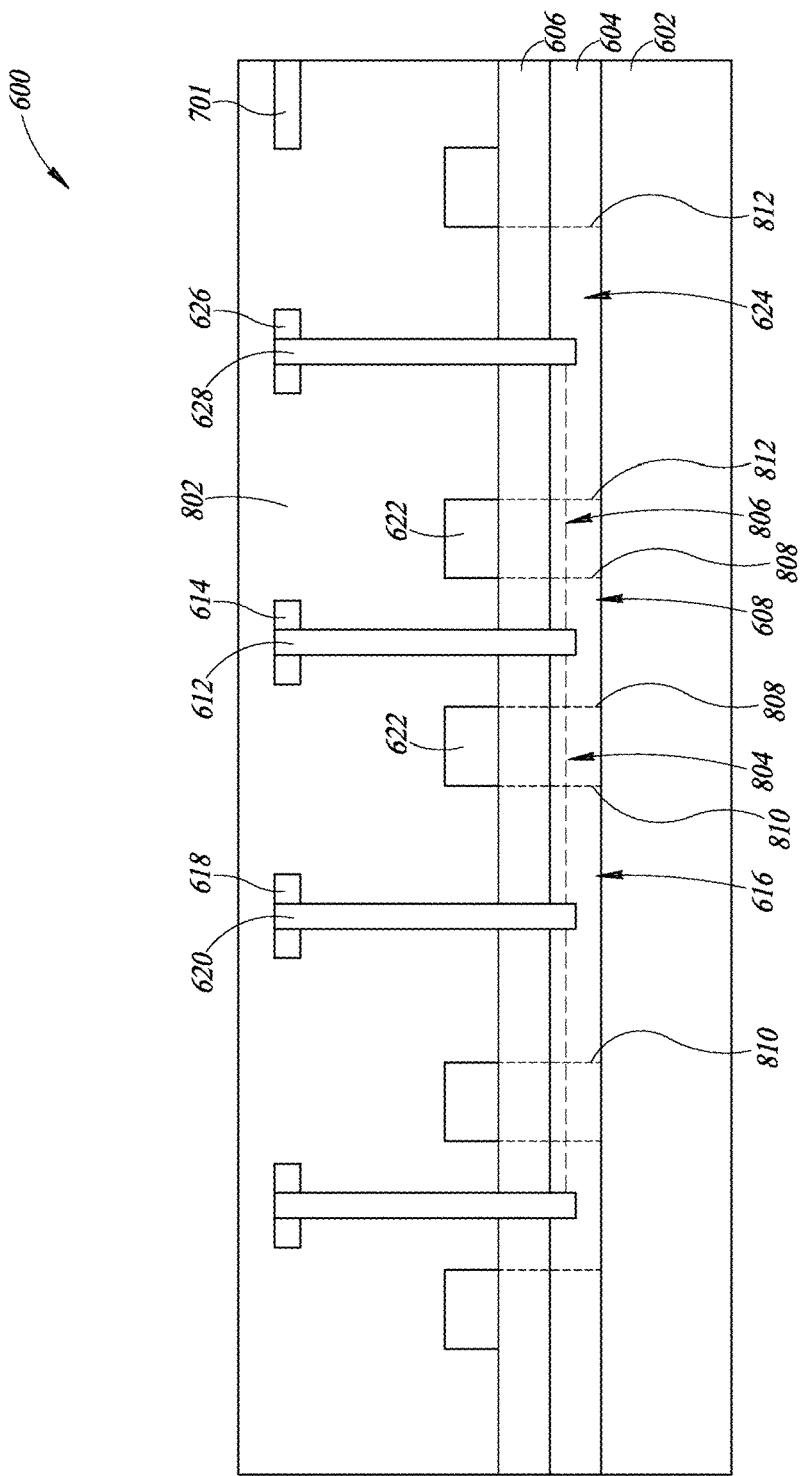
FIG. 8 is a side cut away view of the plurality of dissimilar square waffle gate parallel transistors 600 of FIG. 6, taken at the cross section line BB of FIG. 7.

FIG. 8 is a side cut away view of the plurality of dissimilar square waffle gate parallel transistors 600 of FIG. 6, taken at the cross section line BB of FIG. 7. FIG. 8 depicts the first and second transistors as discussed above. In addition, FIG. 8 depicts a top surface of the second layer 606 covered by an encapsulant 802 that provides electrical insulation between the components. The encapsulant 802 covers the gate 622, the conductive vias 612, 620, 628, the source and drain interconnect fingers 610, 618, 626, and the source and drain master interconnects 700, 701. The encapsulant is a molding compound in one embodiment and any other insulator in other embodiments.

Also shown in FIG. 8 are lateral boundaries of the source and drain regions. For example, the source region 608 has lateral boundaries 808 defined by the lines of the gate 622. Additionally, the drain region 616 has lateral boundaries 810 and the drain region 624 has lateral boundaries 812 defined by the lines of the gate 622. The lateral boundaries 808, 810, 812 may be reflected only in the footprint of the gate 622. In other embodiments, changes in doping or changes in materials may mark the lateral boundaries 808, 810, 812.

The gate 622 controls the conductivity of the first layer 604 from the source region 608 to the drain region 616 by applying a voltage potential to the gate 622. A first channel 804 is activated by alternating between a voltage greater than a threshold voltage and a voltage less than a threshold voltage applied to the gate 622. When activated, the first channel 804 forms from the source region 608 to the drain region 616, permitting charge carriers to flow between the source region 608 and the drain region 616.

The gate 622 also controls the conductivity of the first layer 604 from the source region 608 to the drain region 624 by applying the voltage potential to the gate 622. A second channel 806 is activated by alternating between a voltage greater than a threshold voltage and a voltage less than a threshold voltage applied to the gate 622. When activated, the second channel 806 forms from the source region 608 to the drain region 624, permitting charge carriers to flow between the source region 608 and the drain region 624.

Unlike the square waffle gate parallel transistors 300, the plurality of dissimilar square waffle gate parallel transistors 600 has the gate 622 spaced different distances from the centers of respective source and drain regions. The gate layout of the plurality of dissimilar square waffle gate parallel transistors 600 permits each of the transistors to be shifted to have a longer length in the drain region than in the source region or a longer length in the source region than in the drain region.

Figure 9:
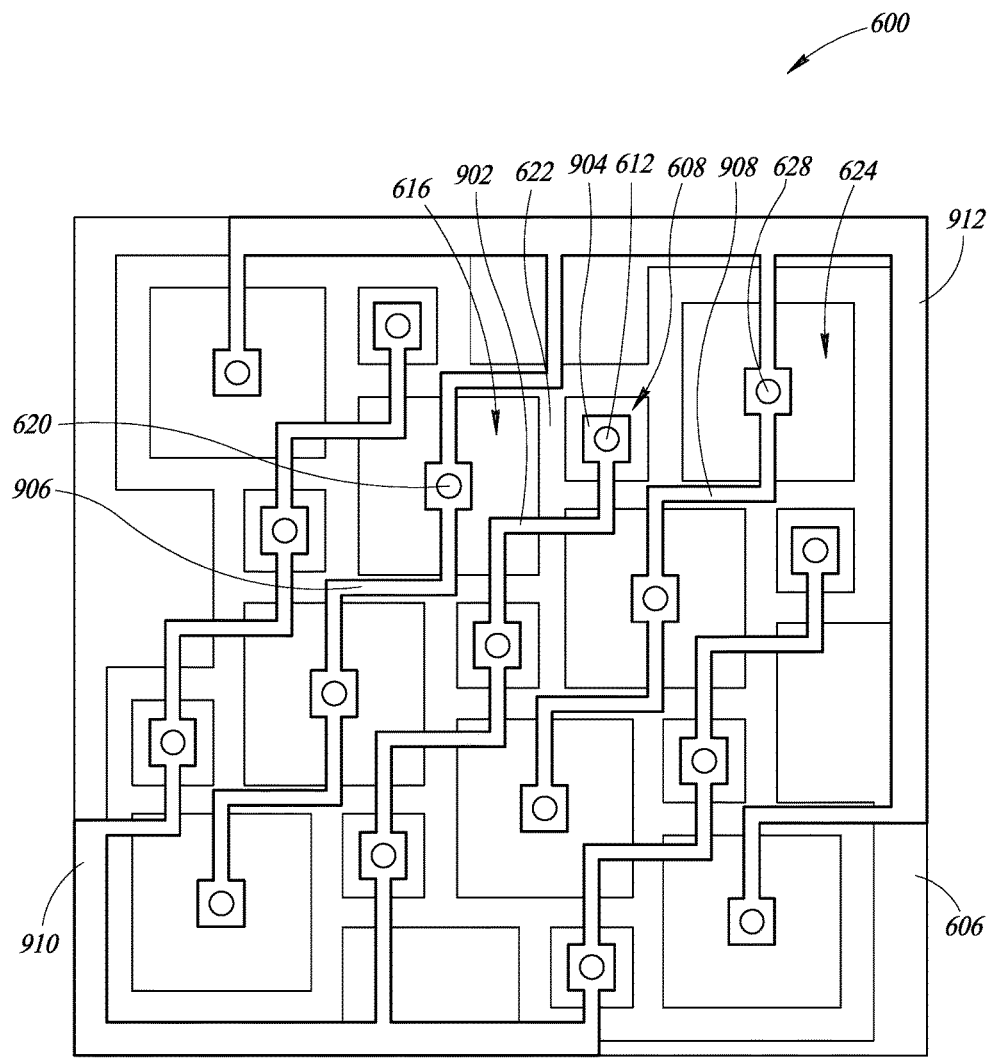
FIG. 9 is a top view of the plurality of dissimilar square waffle gate parallel transistors 600 having an alternate interconnect finger pattern.

FIG. 9 is a top view of the plurality of dissimilar square waffle gate parallel transistors 600 having an alternate interconnect finger pattern. Like FIG. 7, the embodiment depicted in FIG. 9 includes 24 parallel transistors, each with a conductive via coupled to a shared source region or a shared drain region. The shared source regions and the shared drain regions are shared with two or more transistors.

Coupled to the source region 608 is a source interconnect finger 902 coupled to the source region 608 by the conductive via 612. The conductive via 612 passes through the second layer 606 and terminates at the first end in the first layer 604. In other embodiments other connectors are used in place of the conductive via 612, such as a contact pad. The conductive via 612 terminates at the second end in the source interconnect finger 902 at a via terminal 904. The via terminal 904 is an enlarged portion of the source interconnect finger 902 that couples the source interconnect finger 902 to the conductive via 612. The source interconnect finger 902 connects to other source regions in the plurality of dissimilar square waffle gate parallel transistors 600, but only uses lines parallel to lines of the gate 622, stepping between via terminals with 90 degree corners.

Coupled to the drain region 616 is a drain interconnect finger 906 coupled to the drain region 616 by the conductive via 620. The conductive via 620 passes through the second layer 606 and terminates at the first end in the first layer 604. In other embodiments other connectors are used in place of the conductive via 620, such as a contact pad. The conductive via 620 terminates at the second end in the drain interconnect finger 906 at a via terminal. The drain interconnect finger 906 connects to other drain regions in the plurality of dissimilar square waffle gate parallel transistors 600, but only uses lines parallel to lines of the gate 622, stepping between via terminals with 90 degree corners.

Similarly, coupled to the drain region 624 is a drain interconnect finger 908 coupled to the drain region 624 by the conductive via 628. The conductive via 628 passes through the second layer 606 and terminates at the first end in the first layer 604. In other embodiments other connectors are used in place of the conductive via 628, such as a contact pad. The conductive via 628 terminates at the second end in the drain interconnect finger 908 at a via terminal. The drain interconnect finger 908 connects to other drain regions in the plurality of dissimilar square waffle gate parallel transistors 600, but only uses lines parallel to lines of the gate 622, stepping between via terminals with 90 degree corners.

In some embodiments, the source interconnect finger 902 is coupled to other source interconnect fingers by a source master interconnect 910, and the drain interconnect finger 906 is coupled to the drain interconnect finger 908 and to other drain interconnect fingers by a drain master interconnect 912. The embodiment shown in FIG. 9 includes interconnect fingers and master interconnects with only right angle connections, meeting possible design or manufacturing constraints.

Figure 10:
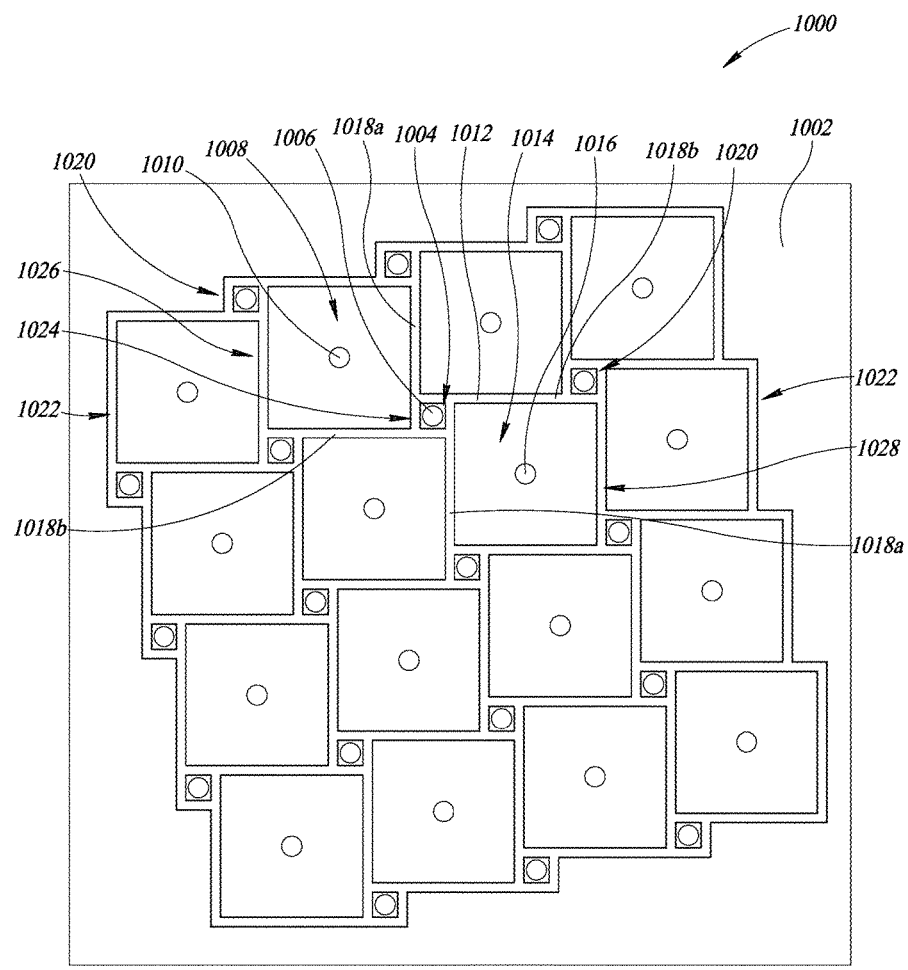
FIG. 10 is a top view of an alternate embodiment of the gate pattern with a different position and ratio of source to drain areas.

FIG. 10 is a top view of an alternate embodiment of the gate pattern with a different position and ratio of source to drain areas. Depicted is a plurality of dissimilar square waffle gate parallel transistors 1000. FIG. 10 depicts an HEMT type transistor; however, any one of a number of transistor layer technologies can be used. A source region 1004 is at or below the second layer 1002. The source region 1004 is one terminal of one of the plurality of dissimilar square waffle gate parallel transistors 1000. A drain region 1008 is at or below the second layer 1002 and is adjacent to the source region 1004. A drain region 1014 is at or below the second layer 1002 and is adjacent to the source region 1004 on a side opposite from the drain region 1008.

Although not shown, in some embodiments the source regions are coupled together by a network of source interconnect fingers and a source master interconnect. The drain regions are coupled together by a network of drain interconnect fingers and a drain master interconnect. Coupled between one of the source interconnect fingers and the source region 1004 is a conductive via 1006. Coupled between one of the drain interconnect fingers and the drain region 1008 is a conductive via 1010. Coupled between one of the drain interconnect fingers and the drain region 1014 is a conductive via 1016.

On the second layer 1002 between the source region 1004 and the drain region 1008 is a gate 1012. In the plurality of dissimilar square waffle gate parallel transistors 1000, the gate 1012 extends in a repeating pattern with a first group of lines 1018a intersecting a second group of lines 1018b to form small frames 1020 around the source regions and large frames 1022 around the drain regions. In an alternative embodiment, the repeating pattern forms small frames around the drain regions and large frames around the source regions. Each one of the small frames 1020 are adjacent to four large frames 1022 and each one of the large frames 1022 are adjacent to four small frames 1020, except at the perimeter of the pattern in which one or more sides of each frame are not adjacent to another frame. Due to the size disparity of the frames, each large frame 1022 is also adjacent to four large frames 1022, except at the perimeter of the pattern in which one or more sides of each frame are not adjacent to another frame.

In contrast to FIG. 7, a frame 1024 around the source region 1004 is positioned adjacent to a bottom portion of a right side of a frame 1026 around the drain region 1008 and is positioned adjacent to a top portion of a left side of a frame 1028 around the drain region 1014. Also in contrast to FIG. 7, the size disparity between the source regions, the gate width, and the drain regions is increased.

Figure 11:
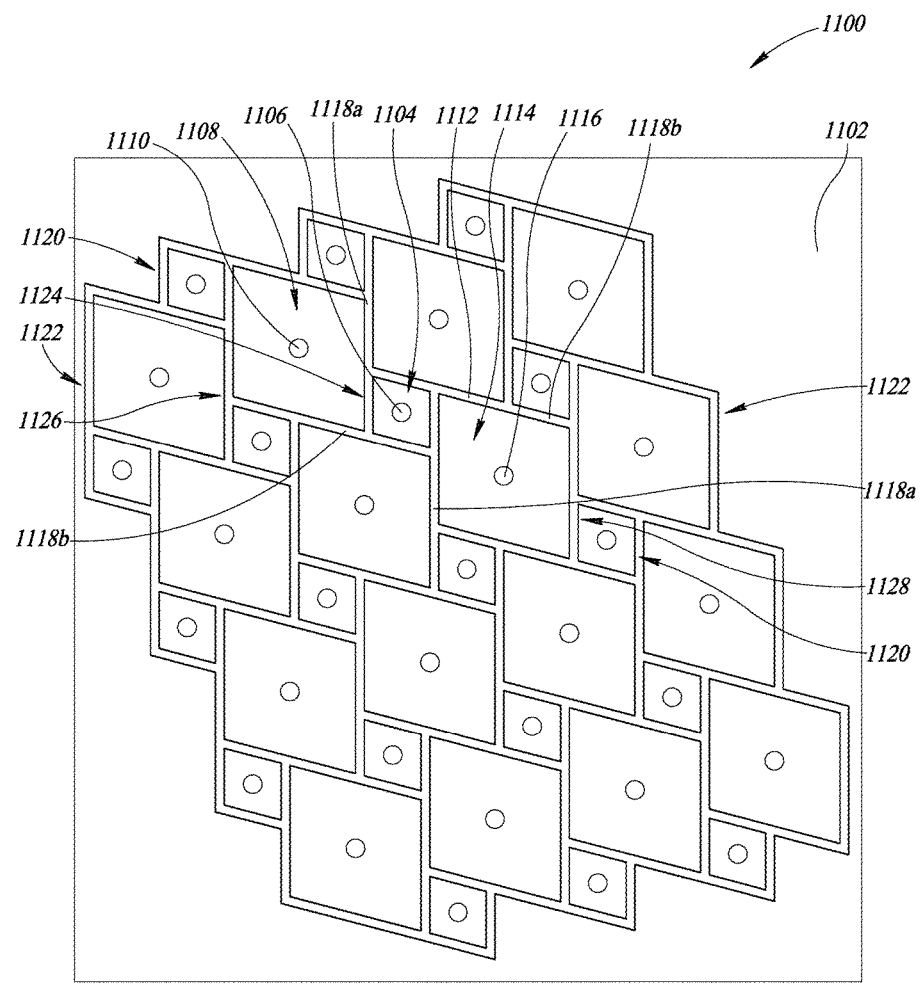
FIG. 11 is a top view of an alternate embodiment of the gate pattern with non-square frames.

FIG. 11 is a top view of an alternate embodiment of the gate pattern with non-square frames. Depicted is a plurality of dissimilar parallelogram waffle gate parallel transistors 1100. FIG. 11 depicts an HEMT type transistor; however, any one of a number of transistor layer technologies can be used. A source region 1104 is at or below the second layer 1102. The source region 1104 is one terminal of one of the plurality of dissimilar parallelogram waffle gate parallel transistors 1100. A drain region 1108 is at or below the second layer 1102 and is adjacent to the source region 1104. A drain region 1114 is at or below the second layer 1102 and is adjacent to the source region 1104 on a side opposite from the drain region 1108.

Although not shown, in some embodiments the source regions are coupled together by a network of source interconnect fingers and a source master interconnect. The drain regions are coupled together by a network of drain interconnect fingers and a drain master interconnect. Coupled between one of the source interconnect fingers and the source region 1104 is a conductive via 1106. Coupled between one of the drain interconnect fingers and the drain region 1108 is a conductive via 1110. Coupled between one of the drain interconnect fingers and the drain region 1114 is a conductive via 1116.

On the second layer 1102 between the source region 1104 and the drain region 1108 is a gate 1112. In the plurality of dissimilar parallelogram waffle gate parallel transistors 1100, the gate 1112 extends in a repeating pattern with a first group of lines 1118a intersecting a second group of lines 1118b to form small frames 1120 around the source regions and large frames 1122 around the drain regions. In an alternative embodiment, the repeating pattern forms small frames around the drain regions and large frames around the source regions. Each one of the small frames 1120 are adjacent to four large frames 1122 and each one of the large frames 1122 are adjacent to four small frames 1120, except at the perimeter of the in which one or more sides of each frame are not adjacent to another frame. Due to the size disparity of the frames, each large frame 1122 is also adjacent to four large frames 1122, except at the perimeter of the pattern in which one or more sides of each frame are not adjacent to another frame.

In contrast to FIG. 7, a frame 1124 around the source region 1104 is positioned adjacent to a bottom portion of a right side of a frame 1126 around the drain region 1108 and is positioned adjacent to a top portion of a left side of a frame 1128 around the drain region 1114. Also in contrast to FIG. 7, each of the frames is a parallelogram, but not a square. In some embodiments, the parallelogram frames are rhombuses. In some embodiments, each of the frames around the source regions are parallelograms of a first size and each of the frames around the drain regions are parallelograms of a second size. In one embodiment, the parallelograms of the first size and the parallelograms of the second size have the same interior angles. In other embodiments, the parallelograms of the first size and the parallelograms of the second size have different interior angles. In one embodiment, the gate 1112 has a non-uniform width across each of the lines 1118a, 1118b.

Figure 12:
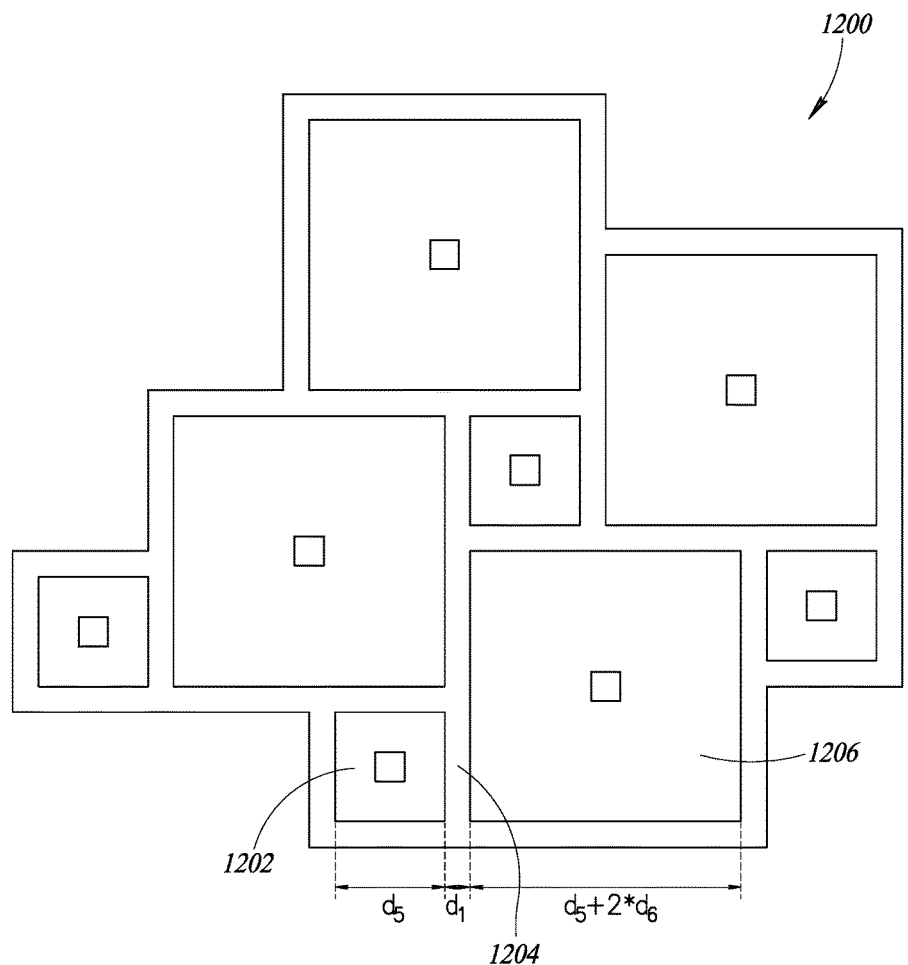
FIG. 12 is a top view of a plurality of dissimilar square waffle gate parallel transistors, showing the dimension variables of the gate pattern frames.

FIG. 12 is a top view of a plurality of dissimilar square waffle gate parallel transistors, showing the dimension variables of the gate pattern frames. A plurality of dissimilar square waffle gate parallel transistors 1200 includes a transistor having a source region 1202, a drain region 1206, and a gate 1204 between the source region 1202 and the drain region 1206. The gate 1204 surrounds the source region 1202 and the drain region 1206.

In the embodiment shown in FIG. 12, the gate 1202 is not spaced an equal distance from a conductive via in the source region 1202 as a conductive via in the drain region 1206.

Due to source/drain asymmetry, $R_{DSon}$ for the plurality of dissimilar square waffle gate parallel transistors 1200 is lower than the plurality of standard gate parallel transistors 100 with an equivalent die footprint and is also lower than the plurality of square waffle gate parallel transistors 300 with an equivalent die footprint. To optimize $R_{DSon}$, in one embodiment, the below equation is satisfied:

$$\frac{d1}{d5} < 2.22369 - 4.34287\left(\frac{d6}{d1}\right) + 4.6647\left(\frac{d6}{d1}\right)^2 - 2.36499\left(\frac{d6}{d1}\right)^3 + 0.444144\left(\frac{d6}{d1}\right)^4$$

In the above equation, d1 equals a width of the gate 1204, d5 equals a width of the source region 1202, and d6 equals a width of a drain extension. The width of the drain extension is computed by taking a width of the drain region 1206 minus d5 and divided by two.

Alternatively, for a fixed $R_{DSon}$, the plurality of dissimilar square waffle gate parallel transistors 1200 has a smaller die footprint than the plurality of standard gate parallel transistors 100 and also has a smaller die footprint than the plurality of square waffle gate parallel transistors 300. In one embodiment, the reduction in area can be determined using the equation below:

$$AreaIncrement_{SQR,FING} = \frac{A_{SQR} - A_{FING}}{A_{FING}} = \frac{A_{SQR}}{\left(\frac{W}{L}\right)_{SQR}} \times \frac{\left(\frac{W}{L}\right)_{FING}}{A_{FING}} - 1$$

In the above equation, $A_{SQR}$ is a total area of a single transistor of the plurality of dissimilar square waffle gate parallel transistors 1200, $A_{FING}$ is a total area of a single transistor of the plurality of standard gate parallel transistors 100, $(W/L)_{SQR}$ is a width to length ratio of a single transistor of the plurality of dissimilar square waffle gate parallel transistors 1200, and $(W/L)_{FING}$ is a width to length ratio of a single transistor of the plurality of standard gate parallel transistors 100. The width to length ratios are, in one embodiment, calculated using finite elements method. Thus, $AreaIncrement_{SQR,FING}$ is the ratio of area reduction based on the difference between topologies of a dissimilar square waffle gate parallel transistors and standard gate parallel transistors.

FIGS. 13A-13G are various embodiments of different source to gate to drain ratios for dissimilar square waffle gate parallel transistors. The ratios are exemplary ratios showing relative sizing of one dimension of frames of the transistors, such as width. The ratios shown are exemplary ratios, and other larger or smaller ratios are also within the scope of the disclosure.

Figure 13A:
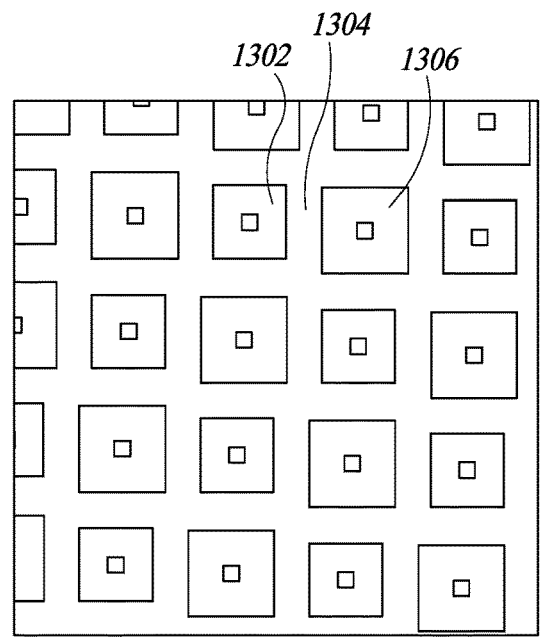
FIGS. 13A-13G are various embodiments showing different source to gate to drain ratios.

FIG. 13A depicts a plurality of dissimilar square waffle gate parallel transistors including a transistor having a source region 1302, a drain region 1306, and a gate 1304 between the source region 1302 and the drain region 1306. In this embodiment, the ratio of the drain region 1306 to the source region 1302 is 1.2:1 and the ratio of the gate 1304 to the source region 1302 is 0.5:1.

Figure 13B:
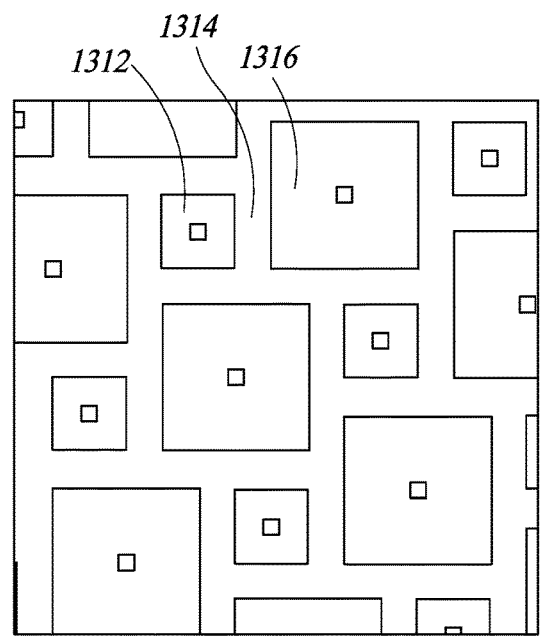

FIG. 13B depicts a plurality of dissimilar square waffle gate parallel transistors including a transistor having a source region 1312, a drain region 1316, and a gate 1314 between the source region 1312 and the drain region 1316. In this embodiment, the ratio of the drain region 1316 to the source region 1312 is 2:1 and the ratio of the gate 1314 to the source region 1312 is 0.5:1.

Figure 13C:
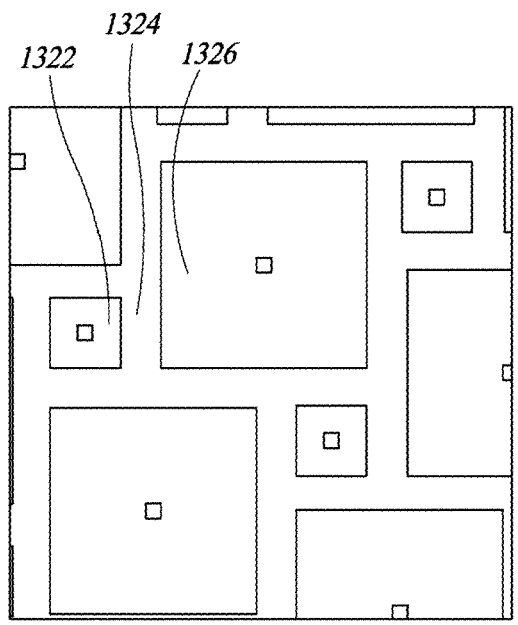

FIG. 13C depicts a plurality of dissimilar square waffle gate parallel transistors including a transistor having a source region 1322, a drain region 1326, and a gate 1324 between the source region 1322 and the drain region 1326. In this embodiment, the ratio of the drain region 1326 to the source region 1322 is 3:1 and the ratio of the gate 1324 to the source region 1322 is 0.5:1.

Figure 13D:
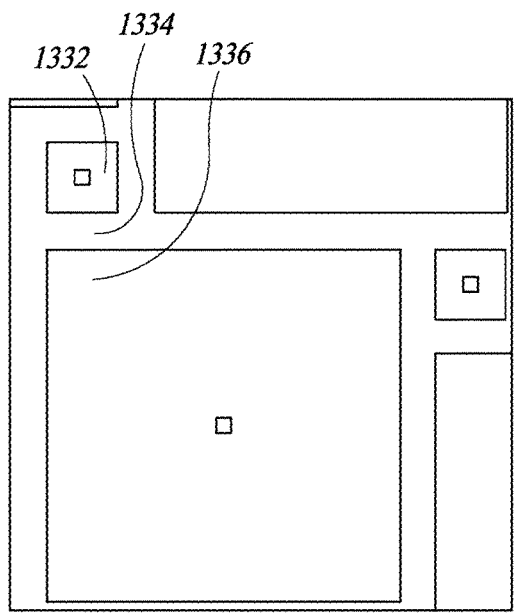

FIG. 13D depicts a plurality of dissimilar square waffle gate parallel transistors including a transistor having a source region 1332, a drain region 1336, and a gate 1334 between the source region 1332 and the drain region 1336. In this embodiment, the ratio of the drain region 1336 to the source region 1332 is 5:1 and the ratio of the gate 1334 to the source region 1332 is 0.5:1.

Figure 13E:
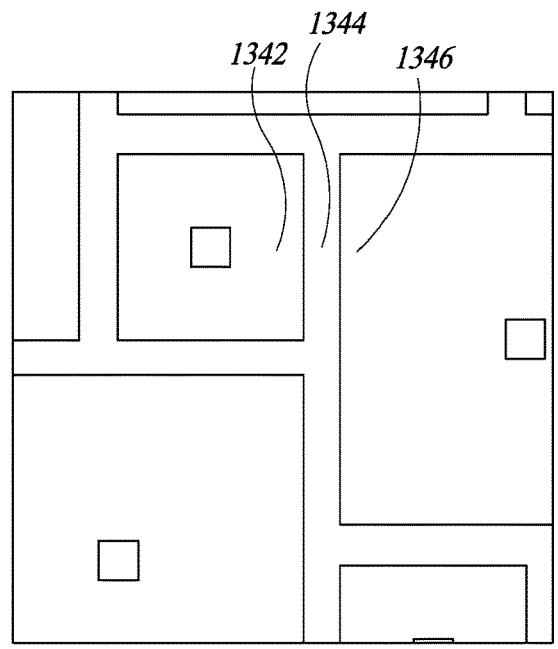

FIG. 13E depicts a plurality of dissimilar square waffle gate parallel transistors including a transistor having a source region 1342, a drain region 1346, and a gate 1344 between the source region 1342 and the drain region 1346. In this embodiment, the ratio of the drain region 1346 to the source region 1342 is 2:1 and the ratio of the gate 1344 to the source region 1342 is 0.2:1.

Figure 13F:
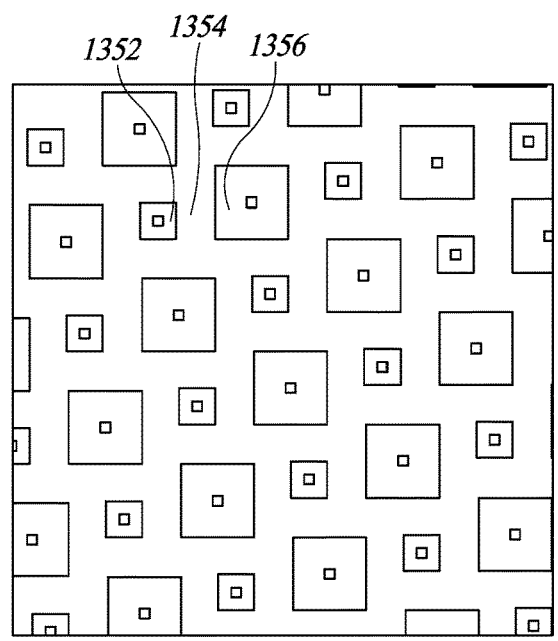

FIG. 13F depicts a plurality of dissimilar square waffle gate parallel transistors including a transistor having a source region 1352, a drain region 1356, and a gate 1354 between the source region 1352 and the drain region 1356. In this embodiment, the ratio of the drain region 1356 to the source region 1352 is 2:1 and the ratio of the gate 1354 to the source region 1352 is 1:1.

Figure 13G:
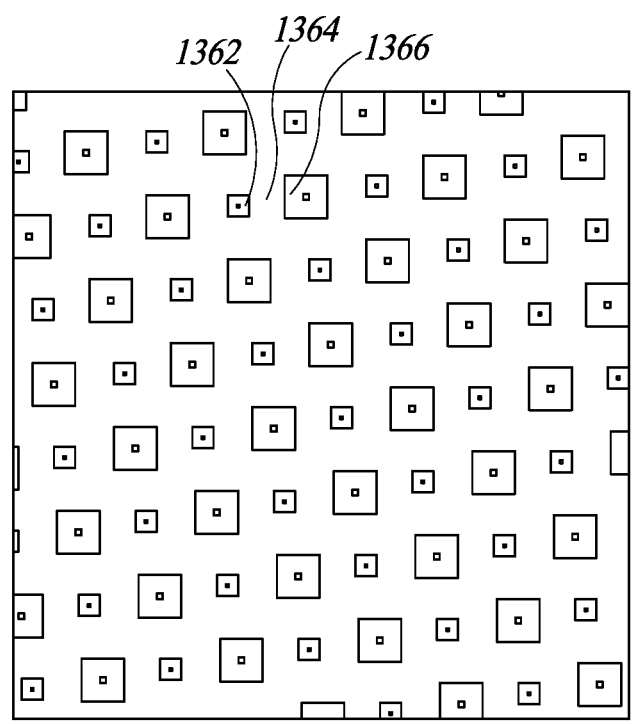

FIG. 13G depicts a plurality of dissimilar square waffle gate parallel transistors including a transistor having a source region 1362, a drain region 1366, and a gate 1364 between the source region 1362 and the drain region 1366. In this embodiment, the ratio of the drain region 1366 to the source region 1362 is 2:1 and the ratio of the gate 1364 to the source region 1362 is 2:1.

Figure 14:
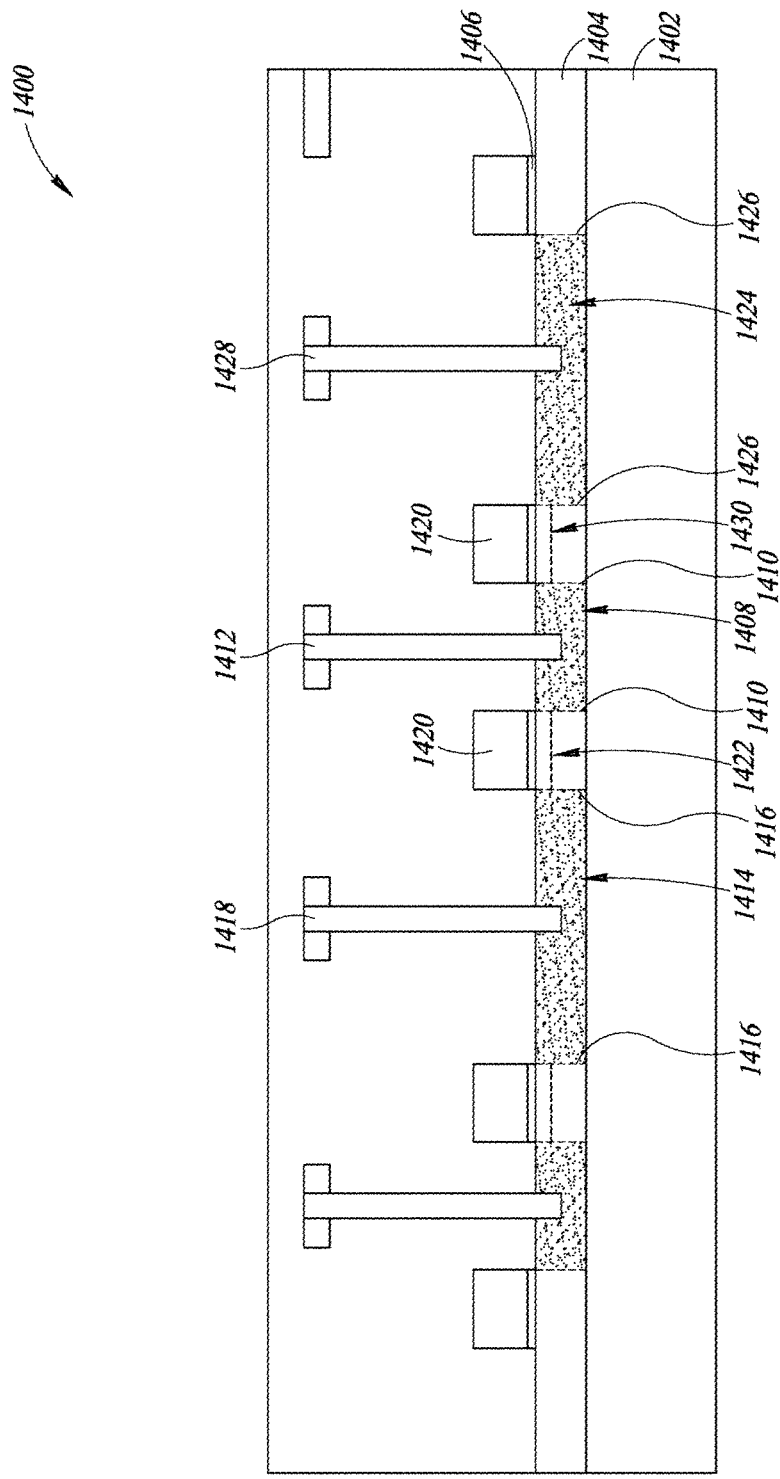
FIG. 14 is an alternate embodiment of the plurality of dissimilar square waffle gate parallel transistors, showing a cross section of a device with MOSFET based transistors.

FIG. 14 is an alternate embodiment of the plurality of dissimilar square waffle gate parallel transistors, showing a cross section of a device with MOSFET based transistors. FIG. 14 depicts parallel metal-oxide-semiconductor field effect transistors (MOSFET) with a dissimilar square waffle gate. In one embodiment, a substrate 1402 is intrinsic silicon, a semiconductor layer 1404 is a semiconductor, such as doped silicon, and the insulator 1406 is an insulating material, such as silicon dioxide or silicon nitride. In some embodiments with MOSFET transistors, the insulator 1406 on the semiconductor layer 1404 does not extend over a majority of the area of the semiconductor layer 1404.

Like the dissimilar square waffle gate parallel transistors 600, the dissimilar square waffle gate parallel transistors 1400 includes source and drain regions; however, in this embodiment the regions are defined by doping of the semiconductor layer 1404. For example, the source region 1408 is a doped region of the semiconductor layer 1404, with the doping extending to the lateral boundaries 1410. A conductive via 1412 couples to the source region 1408. The drain region 1414 is a doped region of the semiconductor layer 1404, with the doping extending to the lateral boundaries 1416. A conductive via 1418 couples to the drain region 1414. In one embodiment, the doping of the source region 1408 is similar to the doping of the drain region 1414. In other embodiment, the doping of the source region 1408 is dissimilar or opposite to the doping of the drain region 1414. In some embodiments the semiconductor layer 1404 is also doped.

A gate 1420 operates similarly to the gate 622, with an electric potential causing a channel 1422 to activate in the semiconductor layer 1404 between the source region 1408 and the drain region 1414 that allows electric charge to be carried by charge carriers between the source region 1408 and the drain region 1414. The electric potential required at the gate 1422 is dependent on the materials and the doping of the various materials used in the dissimilar square waffle gate parallel transistors 1400.

Similarly, the drain region 1424 is a doped region of the semiconductor layer 1404, with the doping extending to the lateral boundaries 1426. A conductive via 1428 couples to the drain region 1424. In one embodiment, the doping of the source region 1408 is similar to the doping of the drain region 1424. In other embodiment, the doping of the source region 1408 is dissimilar or opposite to the doping of the drain region 1424. In some embodiments the semiconductor layer 1404 is also doped.

The gate 1420 operates similarly to the gate 622, with an electric potential causing a channel 1430 to activate in the semiconductor layer 1404 between the source region 1408 and the drain region 1424 that allows electric charge to be carried by charge carriers between the source region 1408 and the drain region 1424. The electric potential required at the gate 1430 is dependent on the materials and the doping of the various materials used in the dissimilar square waffle gate parallel transistors 1400.

FIG. 15 is a perspective cut away view of an HEMT device that includes a plurality of octagon waffle gate parallel transistors 1500. Like the dissimilar square waffle gate parallel transistors 600 discussed above, the plurality of octagon waffle gate parallel transistors 1500 includes a substrate 1502 covered with a first layer 1504 and a second layer 1506. In some embodiments, the substrate 1502 and layers 1504, 1506 are part of an HEMT, as described above. These embodiments include the substrate 1502 being an AlGaN material, the first layer 1504 being a GaN material, and the second layer 1506 being an AlGaN material. Other embodiments include other transistor types. Other transistor types may follow the same three layer structure as discussed above or may have a different number or type of layers. The substrate 1502 and the layers 1504,1506 are any of the types discussed above with respect to substrate 602 and layers 604,606, in some embodiments.

A source region 1508 is formed in the first layer 1504. The source region 1508 is one terminal of one of the plurality of octagon waffle gate parallel transistors 1500. In some embodiments, the source region 1508 is defined by a frame 1509 around the source region 1508.

Coupled to the source region 1508 is a source interconnect finger 1510 coupled to the source region 1508 by a conductive via 1512. The conductive via 1512 passes through the second layer 1506 and terminates at a first end in the first layer 1504. In other embodiments other connectors are used in place of the conductive via 1512, such as a contact pad. The conductive via 1512 terminates at a second end in the source interconnect finger 1510 at a via terminal 1514. The via terminal 1514 is an enlarged portion of the source interconnect finger 1510 that couples the source interconnect finger 1510 to the conductive via 1512. The source interconnect finger 1510 is a conductive line connecting source regions in the plurality of octagon waffle gate parallel transistors 1500 together with respective conductive vias and via terminals.

Adjacent to the source region 1508 is a drain region 1516 formed in the first layer 1504. The drain region 1516 is a second terminal of one of the plurality of octagon waffle gate parallel transistors 1500. In some embodiments, the drain region 1516 is defined by a frame 1517 around the drain region 1516.

Coupled to the drain region 1516 is a drain interconnect finger 1518 coupled to the drain region 1516 by a conductive via 1520. The conductive via 1520 passes through the second layer 1506 and terminates at a first end in the first layer 1504. In other embodiments other connectors are used in place of the conductive via 1520, such as a contact pad. The conductive via 1520 terminates at a second end in the drain interconnect finger 1518 at a via terminal. The via terminal is an enlarged portion of the drain interconnect finger 1518 that couples the drain interconnect finger 1518 to the conductive via 1520. The drain interconnect finger 1518 is a conductive line connecting drain regions in the plurality of octagon waffle gate parallel transistors 1500 together with respective conductive vias and via terminals. In one embodiment the drain interconnect finger 1518 extends in a parallel direction to the source interconnect finger 1510.

On the second layer 1506 between the source region 1508 and the drain region 1516 is a gate 1522. In the plurality of octagon waffle gate parallel transistors 1500, the gate 1522 extends across the second layer 1506 in an alternating pattern with lines 1523a, 1523b forming square frames 1530 around the source regions and octagon frames 1532 around the drain regions. In an alternative embodiment, the alternating pattern forms square frames around the drain regions and octagon frames around the source regions. In one embodiment the frames 1530, 1532 are on the second layer 1506 at lateral boundaries of the source region 1508 and the drain region 1516, with an opening directly over the source region 1508 and the drain region 1516. Each one of the square frames 1530 are adjacent to four octagon frames 1532 and each one of the octagon frames 1532 are adjacent to four square frames 1530, except at the perimeter of the pattern in which one or more sides of each frame are not adjacent to another frame. Due to the shape of the frames, each octagon frame 1532 is also adjacent to four other octagon frames 1532, except at the perimeter of the pattern in which one or more sides of each frame are not adjacent to another frame.

In some embodiments, the gate is formed from lines 1523a, 1523b. A first group of lines 1523a encircles the square frames and a second group of lines 1523b runs diagonally connecting the first group of lines 1523a around each square frame to another first group of lines 1523a around another square frame. In some embodiments each of the lines 1523a, 1523b have the same width, and in some embodiments each of the lines 1523a, 1523b have the same length.

The source interconnect finger 1510 and the drain interconnect finger 1518 are in a first plane parallel to a second plane in which the gate 1522 resides. The source interconnect finger 1510 and the drain interconnect finger 1518 are at the same angle within the first plane as the angle of the first group of lines 1532a of the gate 1522 in the second plane, the angles measured around an axis tangent to the planes. In an alternate embodiment, the source interconnect finger 1510 and the drain interconnect finger 1518 extend at a different angle within the first plane than the angle of each line of the gate 1522 within the second plane. In some embodiments the source interconnect finger 1510 and the drain interconnect finger 1518 are in different planes parallel to each other. And in some embodiments portions of the source interconnect finger 1510 and the drain interconnect finger 1518 are in the first plane, and portions of the source interconnect finger 1510 and the drain interconnect finger 1518 are in a third plane parallel to the first plane. In some embodiments, the source interconnect finger 1510 and the drain interconnect finger 1518 are parallel to an edge of the die. In some embodiments, at least one of the lines 1523a, 1523b of the gate 1522 is parallel to an edge of the die.

In the embodiment shown in FIG. 15 the gate 1522 is not spaced an equal distance from the conductive via 1512 in the source region 1508 as the conductive via 1520 in the drain region 1516. Due to source/drain asymmetry, $R_{DSon}$ for the plurality of octagon waffle gate parallel transistors 1500 is lower than the plurality of standard gate parallel transistors 100 with an equivalent die footprint and is also lower than the plurality of square waffle gate parallel transistors 300 with an equivalent die footprint.

Alternatively, for a fixed $R_{DSon}$, the plurality of octagon waffle gate parallel transistors 1500 has a smaller die footprint than the plurality of standard gate parallel transistors 100 and also has a smaller die footprint than the plurality of square waffle gate parallel transistors 300.

In some embodiments, the source/drain asymmetry also provides for a higher voltage tolerance by the plurality of octagon waffle gate parallel transistors 1500 compared to the plurality of standard gate parallel transistors 100 and the plurality of square waffle gate parallel transistors 300. For example, the plurality of octagon waffle gate parallel transistors 1500 may be suitable for applications up to 20 volts to 1000 volts, depending on the transistor technology.

Adjacent to the source region 1508 on a side opposite from the drain region 1516 is a drain region 1524 formed in the first layer 1504. The drain region 1524 is a second terminal of one of the plurality of octagon waffle gate parallel transistors 1500. The drain region 1524 is defined by doping levels of the first layer 1504 in some embodiments. In other embodiments, the drain region 1524 is defined by a frame 1525 around the drain region 1524.

Coupled to the drain region 1524 is a drain interconnect finger 1526 coupled to the drain region 1524 by a conductive via 1528. The conductive via 1528 passes through the second layer 1506 and terminates at a first end in the first layer 1504. In other embodiments other connectors are used in place of the conductive via 1528, such as a contact pad. The conductive via 1528 terminates at a second end in the drain interconnect finger 1526 at a via terminal. The via terminal is an enlarged portion of the drain interconnect finger 1526 that couples the drain interconnect finger 1526 to the conductive via 1528. The drain interconnect finger 1526 extends linearly, connecting to other drain regions in the plurality of octagon waffle gate parallel transistors 1500 with respective conductive vias and via terminals. In one embodiment the drain interconnect finger 1526 extends in a parallel direction to the source interconnect finger 1510 and the drain interconnect finger 1518.

On the second layer 1506 between the source region 1508 and the drain region 1524 is the gate 1522. The alternating pattern, with the lines 1523a, 1523b forming the square frames 1530 around the source regions and the octagon frames 1532 around the drain regions, extends around the drain region 1524. In one embodiment, each of lines of the octagon frames 1532 have an equal length. In an alternate embodiment, each of lines of the octagon frames 1532 does not have an equal length. For example, the second group of lines 1523b between the source region 1508 and the drain region 1516 can be longer or shorter than the first group of lines 1523a between the drain region 1516 and an adjacent drain region.

The drain interconnect finger 1526 is in the first plane with the source interconnect finger 1510 and the drain interconnect finger 1518, parallel to the second plane in which the gate 1522 resides. The source interconnect finger 1510, the drain interconnect finger 1518, and the drain interconnect finger 1526 are at the same angle within the first plane as the angle of the first group of lines 1532a of the gate 1522 in the second plane, the angles measured around an axis tangent to the planes. In an alternate embodiment, the source interconnect finger 1510, the drain interconnect finger 1518, and the drain interconnect finger 1526 extend at a different angle within the first plane than the angle of each line of the gate 1522 within the second plane. In some embodiments the source interconnect finger 1510, the drain interconnect finger 1518, and the drain interconnect finger 1526 are in different planes parallel to each other. And in some embodiments portions of the source interconnect finger 1510, the drain interconnect finger 1518, and the drain interconnect finger 1526 are in the first plane, and portions of the source interconnect finger 1510, the drain interconnect finger 1518, and the drain interconnect finger 1526 are in the third plane parallel to the first plane. In some embodiments, the source interconnect finger 1510, the drain interconnect finger 1518, and the drain interconnect finger 1526 are parallel to an edge of the die. And in some embodiments, at least one of the lines 1523a, 1523b of the gate 1522 is parallel to an edge of the die.

Figure 16:
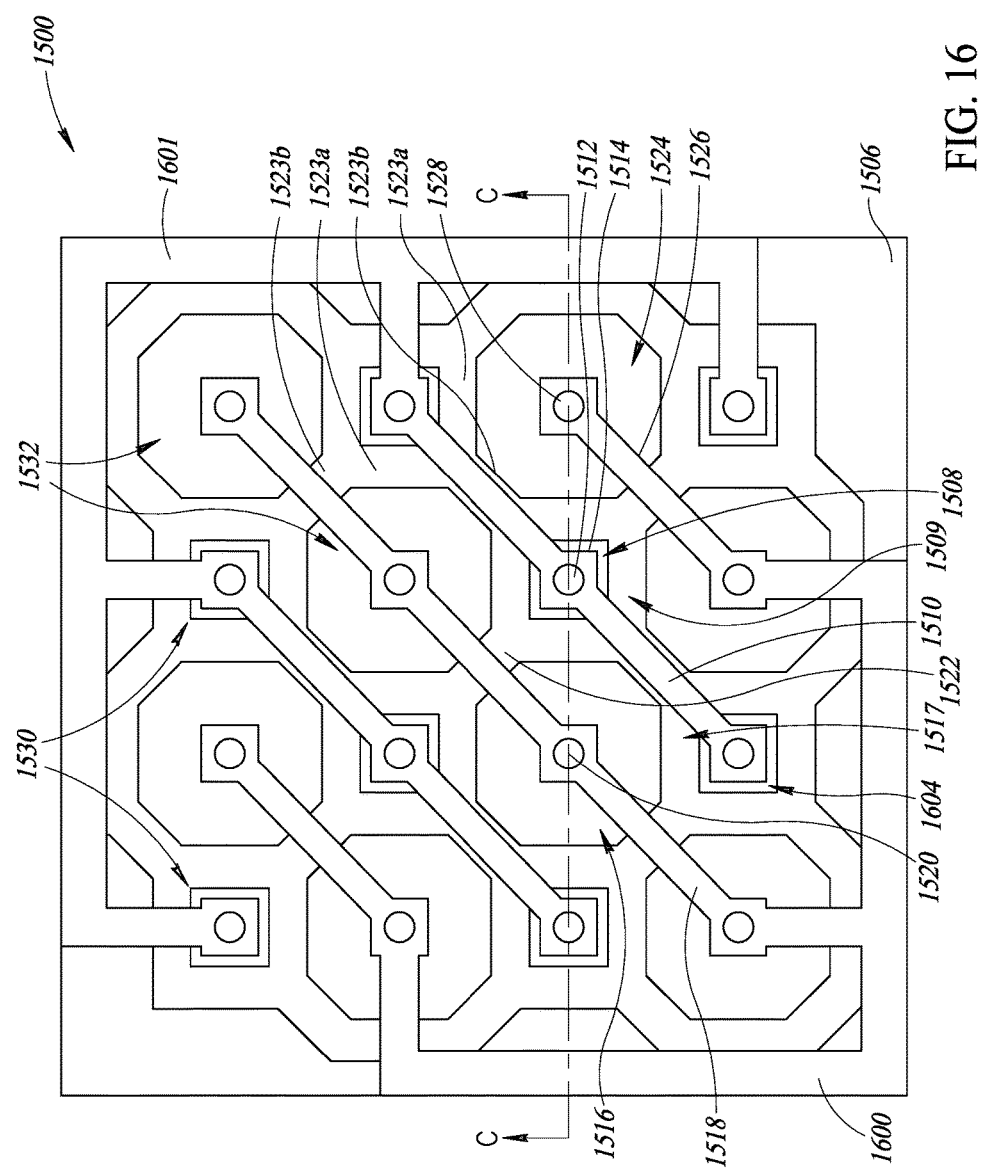
FIG. 16 is a top view of the plurality of octagon waffle gate parallel transistors 1500 of FIG. 15.

FIG. 16 is a top view of the plurality of octagon waffle gate parallel transistors 1500 of FIG. 15. Depicted in FIG. 16 are 24 parallel transistors. Each conductive via is coupled to a shared source region or a shared drain region. The shared source regions and the shared drain regions may be shared with two or more transistors.

A first transistor of the plurality of octagon waffle gate parallel transistors 1500 includes the source region 1508, the drain region 1516, and the gate 1522. A second transistor of the plurality of octagon waffle gate parallel transistors 1500 includes the source region 1508, the drain region 1524, and the gate 1522. The first and second transistors are similarly sized and positioned but 180 degrees out of rotation from each other. The source region 1508 is also shared with a third transistor of the plurality of octagon waffle gate parallel transistors 1500 that includes the source region 1508, a drain region 1602, and the gate 1522. Thus the source region 1508 is shared between the first, second, and third transistors of the plurality of octagon waffle gate parallel transistors 1500. Similarly, the drain region 1516 is a shared drain region. The drain region 1516 is one terminal of the second transistor of the plurality of octagon waffle gate parallel transistors 1500, and also is shared with a fourth transistor that includes a source region 1604, the drain region 1516, and the gate 1522. The pattern continues throughout so that each source and drain region is a terminal of at least two transistors of the plurality of octagon waffle gate parallel transistors 1500.

Additional transistors are formed diagonal to the first transistor using the same source interconnect finger 1510, drain interconnect finger 1518, and gate 1522, but with different conductive vias to the first layer 1504. Additional transistors are formed diagonal to the second transistor using the same source interconnect finger 1510, drain interconnect finger 1526, and gate 1522, but with different conductive vias to the first layer 1504, such as a fifth transistor that includes the source region 1604, the drain region 1602, and the gate 1522. In addition, in some embodiments, the source interconnect finger 1510 is coupled to other source interconnect fingers by a drain master interconnect 1600, and the drain interconnect finger 1518 is coupled to the drain interconnect finger 1526 and to other drain interconnect fingers by a source master interconnect 1601.

Figure 17:
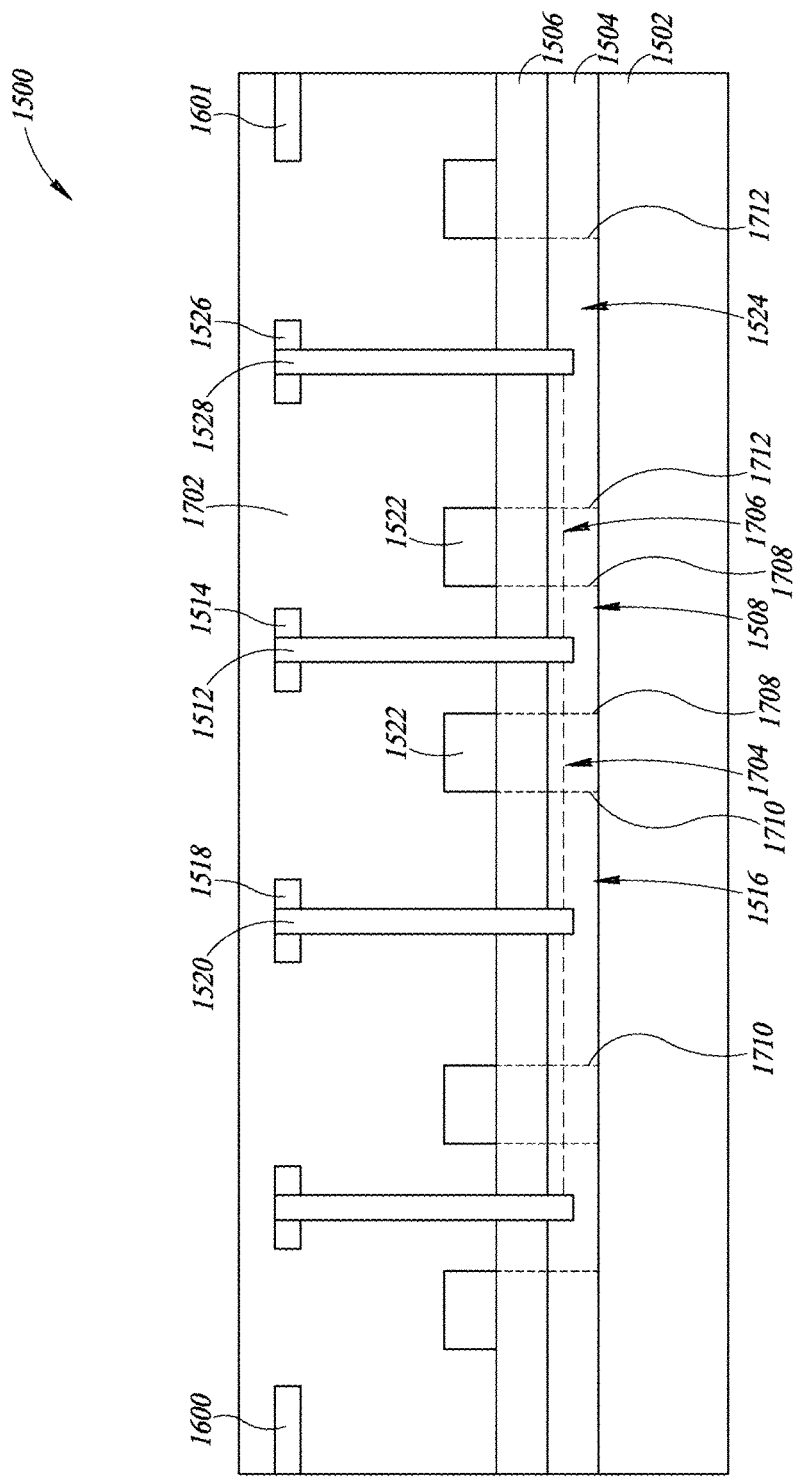
FIG. 17 is a side cut away view of the plurality of octagon waffle gate parallel transistors 1500 of FIG. 6, taken at the cross section line CC of FIG. 16.

FIG. 17 is a side cut away view of the plurality of octagon waffle gate parallel transistors 1500 of FIG. 15, taken at the cross section line CC of FIG. 16. FIG. 17 depicts the first and second transistors as discussed above. In addition, FIG. 17 depicts a top surface of the second layer 1506 covered by an encapsulant 1702 that provides electrical insulation between the components. The encapsulant 1702 covers the gate 1522, the conductive vias 1512, 1520, 1528, the source and drain interconnect fingers 1510, 1518, 1526, and the source and drain master interconnects 700, 701. The encapsulant is a molding compound in one embodiment and any other insulator in other embodiments.

Also shown in FIG. 17 are lateral boundaries of the source and drain regions. For example, the source region 1508 has lateral boundaries 1708 defined by the lines of the gate 1522. Additionally, the drain region 1516 has lateral boundaries 1710 and the drain region 1524 has lateral boundaries 1712 defined by the lines of the gate 1522. The lateral boundaries 1708, 1710, 1712 may be reflected only in the footprint of the gate 1522. In other embodiments, changes in doping or changes in materials may mark the lateral boundaries 1708, 1710, 1712.

The gate 1522 controls the conductivity of the first layer 1504 from the source region 1508 to the drain region 1516 by applying a voltage potential to the gate 1522. A first channel 1704 is activated by alternating between a voltage greater than a threshold voltage and a voltage less than a threshold voltage applied to the gate 1522. When activated, the first channel 1704 forms from the source region 1508 to the drain region 1516, permitting charge carriers to flow between the source region 1508 and the drain region 1516.

The gate 1522 also controls the conductivity of the first layer 1504 from the source region 1508 to the drain region 1524 by applying the voltage potential to the gate 1522. A second channel 1706 is activated by alternating between a voltage greater than a threshold voltage and a voltage less than a threshold voltage applied to the gate 1522. When activated, the second channel 1706 forms from the source region 1508 to the drain region 1524, permitting charge carriers to flow between the source region 1508 and the drain region 1524.

Unlike the square waffle gate parallel transistors 300, the plurality of octagon waffle gate parallel transistors 1500 has the gate 1522 spaced different distances from the centers of respective source and drain regions. The gate layout of the plurality of octagon waffle gate parallel transistors 1500 permits each of the transistors to be shifted to have a longer length in the drain region than in the source region or a longer length in the source region than in the drain region.

Figure 18:
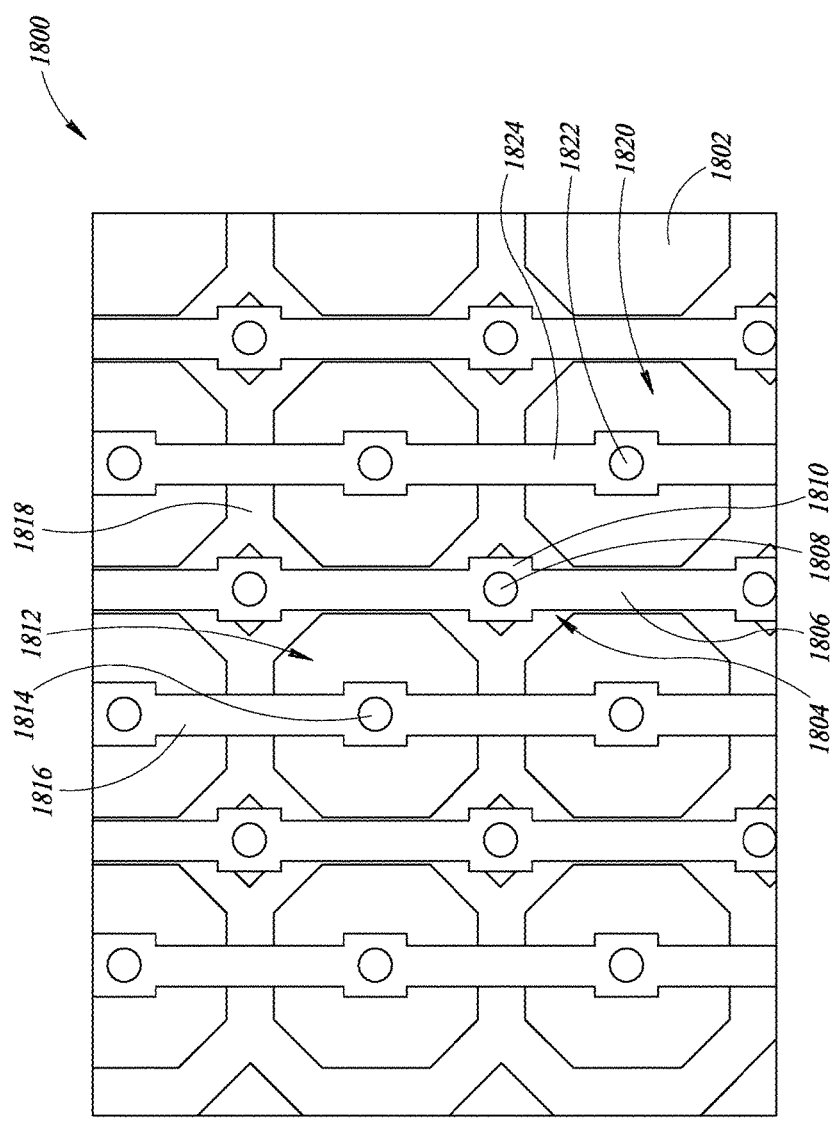
FIG. 18 is a top view of a plurality of octagon waffle gate parallel transistors 1800 having an alternate interconnect finger pattern.

FIG. 18 is a top view of a plurality of octagon waffle gate parallel transistors 1800 having an alternate interconnect finger pattern. Depicted in FIG. 18 are 20 parallel transistors, each with a conductive via coupled to a shared source region or a shared drain region. The shared source regions and the shared drain regions are shared with two or more transistors.

The plurality of octagon waffle gate parallel transistors 1800 includes components similar to the plurality of octagon waffle gate parallel transistors 1500. For example, the plurality of octagon waffle gate parallel transistors 1800 includes a substrate (not pictured), a first layer (not pictured), and a second layer 1802. In some embodiments, the substrate, the first layer, and the second layer 1802 are part of an HEMT, as described above. These embodiments include the substrate being an AlGaN material, the first layer being a GaN material, and the second layer 1802 being an AlGaN material. Other embodiments include other transistor types. Other transistor types may follow the same three layer structure as discussed above or may have a different number or type of layers. The substrate, the first layer, and the second layer 1802 are any of the types discussed above with respect to substrate 602 and layers 604,606, in some embodiments.

The second layer 1802 includes a source region 1804 coupled to a source interconnect finger 1806 through a conductive via 1808 at a via terminal 1810. The second layer 1802 includes a drain region 1812 coupled to a drain interconnect finger 1816 through a conductive via 1814 at a via terminal, and a drain region 1820 coupled to a drain interconnect finger 1824 through a conductive via 1822 at a via terminal. On the second layer 1802 is gate 1818 separating the different source and drain regions.

The source interconnect finger 1806 connects to other source regions in the plurality of octagon waffle gate parallel transistors 1800, but only uses lines parallel to an edge of the second layer 1802. The drain interconnect finger 1812 connects to other drain regions in the plurality of octagon waffle gate parallel transistors 1800, but only uses lines parallel to the edge of the second layer 1802. The drain interconnect finger 1820 connects to other drain regions in the plurality of octagon waffle gate parallel transistors 1800, but only uses lines parallel to the edge of the second layer 1802.

In some embodiments, the source interconnect finger 1806 is coupled to other source interconnect fingers by a source master interconnect, and the drain interconnect finger 1816 is coupled to the drain interconnect finger 1824 and to other drain interconnect fingers by a drain master interconnect. The embodiment shown in FIG. 18 includes interconnect fingers, meeting possible design or manufacturing constraints.

Figure 19:
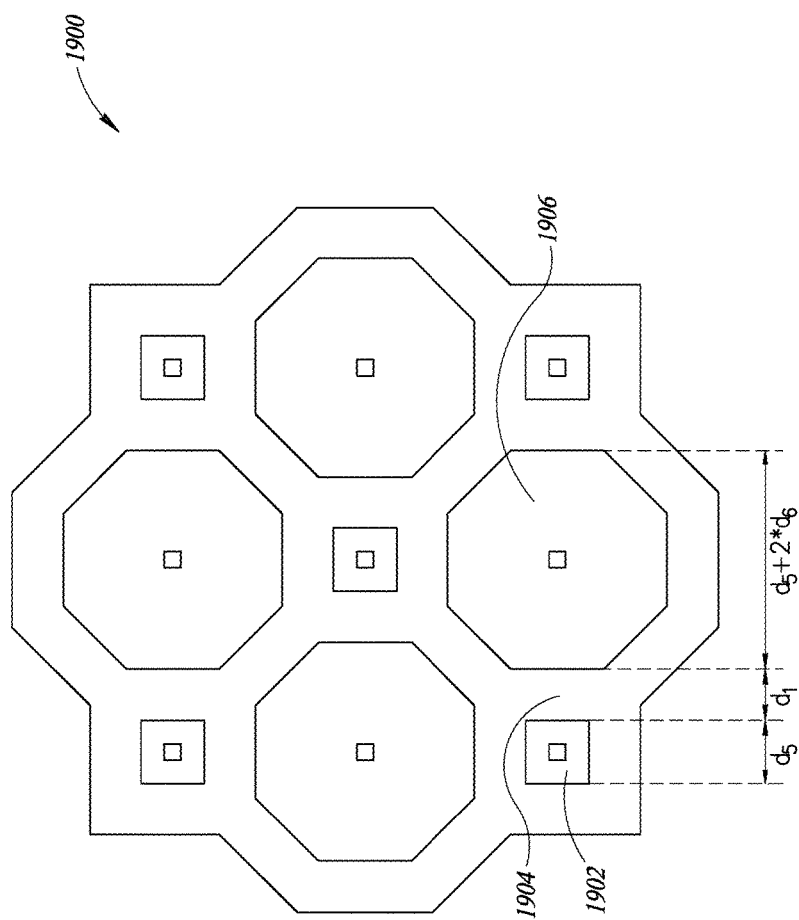
FIG. 19 is a top view of a plurality of octagon waffle gate parallel transistors, showing the dimension variables of the gate pattern frames.

FIG. 19 is a top view of a plurality of octagon waffle gate parallel transistors, showing the dimension variables of the gate pattern frames. A plurality of octagon waffle gate parallel transistors 1900 includes a transistor having a source region 1902, a drain region 1906, and a gate 1904 between the source region 1902 and the drain region 1906. The gate 1904 surrounds the source region 1902 and the drain region 1906.

In the embodiment shown in FIG. 19, the gate 1902 is not spaced an equal distance from a conductive via in the source region 1902 as a conductive via in the drain region 1906. Due to source/drain asymmetry, $R_{DSon}$ for the plurality of octagon waffle gate parallel transistors 1900 is lower than the plurality of standard gate parallel transistors 100 with an equivalent die footprint and is also lower than the plurality of square waffle gate parallel transistors 300 with an equivalent die footprint. To optimize $R_{DSon}$, in one embodiment, the below equation is satisfied:

$$\frac{d1}{d5} < 2.25713 - 2.69205\left(\frac{d6}{d1}\right) + 1.66394\left(\frac{d6}{d1}\right)^2 - 0.347363\left(\frac{d6}{d1}\right)^3$$

In the above equation, d1 equals a width of the gate 1904, d5 equals a width of the source region 1902, and d6 equals a width of a drain extension. The width of the drain extension is computed by taking a width of the drain region 1906 minus d5 and divided by two.

Alternatively, for a fixed $R_{DSon}$, the plurality of octagon waffle gate parallel transistors 1900 has a smaller die footprint than the plurality of standard gate parallel transistors 100 and also has a smaller die footprint than the plurality of square waffle gate parallel transistors 300. In one embodiment, the reduction in area can be determined using the equation below:

$$AreaIncrement_{OCT,FING} = \frac{A_{OCT} - A_{FING}}{A_{FING}} = \frac{A_{OCT}}{\left(\frac{W}{L}\right)_{OCT}} \times \frac{\left(\frac{W}{L}\right)_{FING}}{A_{FING}} - 1$$

In the above equation, $A_{OCT}$ is a total area of a single transistor of the plurality of octagon waffle gate parallel transistors 1900, $A_{FING}$ is a total area of a single transistor of the plurality of standard gate parallel transistors 100, $(W/L)_{OCT}$ is a width to length ratio of a single transistor of the plurality of octagon waffle gate parallel transistors 1900, and $(W/L)_{FING}$ is a width to length ratio of a single transistor of the plurality of standard gate parallel transistors 100. The width to length ratios are, in one embodiment, calculated using finite elements method. Thus, $AreaIncrement_{OCT,FING}$ is the ratio of area reduction based on the difference between topologies of an octagon waffle gate parallel transistors and standard gate parallel transistors.

In other embodiments, other transistor types may be used with the different gate layouts discussed above. For example, in one embodiment, a plurality of parallel transistors is based on a silicon carbon semiconductor. In other embodiments, the plurality of parallel transistors is based on printing electronics manufacturing. And in yet other embodiments, other transistor types may be used to realize the features discussed throughout this application.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A device, comprising:
   a semiconductor layer having a first side;
   a first source region and a first drain region in the semiconductor layer and adjacent to the first side; and
   a metal gate over the first side of the semiconductor layer, the metal gate including a first frame on the first side and at lateral boundaries of the first source region and a second frame on the first side and at lateral boundaries of the first drain region, the first frame having a first opening directly over the first source region, the second frame having a second opening directly over the first drain region, wherein the first frame is an octagon shape and the second frame is a square shape.

2. The device of claim 1 wherein the gate includes a line that forms at least a portion of one side of the first frame and at least a portion of one side of the second frame.

3. The device of claim 1 wherein the first opening has a first area on the first side, and the second opening has a second area on the first side, the first area being smaller than the second area.

4. The device of claim 1, further comprising:
   a second source region and a second drain region in the semiconductor layer and adjacent to the first side, the gate including a third frame on the first side at lateral boundaries of the second source region and a fourth frame on the first side at lateral boundaries of the second drain region, the third frame having a third opening directly over the second source region, the fourth frame having a fourth opening directly over the second drain region the third frame being a different shape than the fourth frame.

5. The device of claim 4 wherein the first frame is the same shape as the third frame and the second frame is the same shape as the fourth frame.

6. The device of claim 4 wherein the gate includes:
   a first line that forms at least a portion of a first side of the first frame and at least a portion of a first side of the second frame;
   a second line that forms at least a portion of a second side of the first frame and at least a portion of a first side of the fourth frame; and
   a third line that forms at least a portion of a second side of the second frame and at least a portion of a first side of the third frame.

7. The device of claim 6 wherein the gate includes a fourth line that forms at least a portion of a third side of the second frame and at least a portion of a second side of the fourth frame.

8. The device of claim 4, further comprising:
   a first interconnect and a second interconnect, the first interconnect electrically coupling the first source region to the second source region, and the second interconnect electrically coupling the first drain region to the second drain region.

9. The device of claim 1 wherein a first channel path in the semiconductor layer selectively couples the first source region to the first drain region.

10. The device of claim 9 wherein a length of the first channel path equals the sum of a first length in the first source region, a second length in the first drain region, and a third length between the first source region and the first drain region, the first length being less than the third length, and the third length being less than the second length.

11. A system, comprising:
    a semiconductor layer having a first side;
    a first transistor including a first source region, a first drain region, and a metal gate, the first source and first drain regions being formed in the semiconductor layer and the gate being formed adjacent to the first side of the semiconductor layer;
    a second transistor including a second source region, a second drain region, and the gate, the second source and second drain regions being formed in the semiconductor layer;
    a third transistor including the first source region, the second drain region, and the gate; and
    a fourth transistor including the second source region, the first drain region, and the gate, the gate having first frames around each of the first and second source regions and second frames around each of the first and second drain regions, wherein each first frame is an octagon shape and each second frame is a square shape.

12. The system of claim 11 wherein the first frames have equal dimensions and the second frames have equal dimensions.

13. The system of claim 11 wherein the first source region is electrically coupled to the second source region and the first drain region is electrically coupled to second drain region.

14. The system of claim 11 wherein one side of a first one of the second frames is shared with one side of a second one of the second frames.

15. A method of manufacturing a transistor, comprising:
forming a semiconductor layer on a substrate;
forming a plurality of source regions and a plurality of drain regions in the semiconductor layer, each one of the plurality of source regions being a different shape than each one of the plurality of drain regions; and
forming a metal gate on the semiconductor layer, the gate being adjacent to portions of the semiconductor layer and at lateral boundaries of each one of the plurality of source regions and each one of the plurality of drain regions, the metal gate including first frames at lateral boundaries of the source regions and second frames at lateral boundaries of the drain regions, the first frames having first openings directly over the source regions, the second frames having second openings directly over the drain regions, wherein the first frames each have an octagon shape and the second frames each have a square shape.

16. The method of manufacturing of claim 15, wherein one of the plurality of source regions is adjacent to four drain regions of the plurality of drain regions, and one of the plurality of drain regions is adjacent to four source regions of the plurality of source regions and is adjacent to four drain regions of the plurality of drain regions.

17. The method of manufacturing of claim 15, further comprising:
forming a first plurality of interconnections and a second plurality of interconnections, the first plurality of interconnections electrically coupling each one of the plurality of source regions together and the second plurality of interconnections electrically coupling each one of the plurality of drain regions together.

* * * * *